(12) United States Patent
Ohmi et al.

(10) Patent No.: US 7,718,484 B2
(45) Date of Patent: *May 18, 2010

(54) METHOD OF FORMING A DIELECTIC FILM THAT CONTAINS SILICON, OXYGEN AND NITROGEN AND METHOD OF FABRICATING A SEMICONDUCTOR DEVICE THAT USES SUCH A DIELECTRIC FILM

(75) Inventors: Tadahiro Ohmi, Miyagi (JP);
Shigetoshi Sugawa, Miyagi (JP);
Masaki Hirayama, Miyagi (JP);
Yasuyuki Shirai, Miyagi (JP)

(73) Assignee: Foundation for Advancement of International Science, Tsukuba (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/979,269

(22) Filed: Oct. 31, 2007

(65) Prior Publication Data

US 2008/0277715 A1 Nov. 13, 2008

Related U.S. Application Data

(62) Division of application No. 10/451,925, filed as application No. PCT/JP01/11596 on Dec. 27, 2001, now Pat. No. 7,439,121.

(30) Foreign Application Priority Data

Dec. 28, 2000 (JP) ............................ 2000-402834
Mar. 28, 2001 (JP) ............................ 2001-094246

(51) Int. Cl.
*H01L 21/336* (2006.01)
(52) U.S. Cl. ...................... 438/211; 438/777
(58) Field of Classification Search .......... 257/E21.179, 257/21.302, 21.422, 21.68; 438/211, 777
See application file for complete search history.

(56) References Cited

U.S. PATENT DOCUMENTS 4,581,622 A 4/1986 Takasaki et al.

(Continued)

FOREIGN PATENT DOCUMENTS

EP 0 844 668 A2 5/1998

(Continued)

OTHER PUBLICATIONS

Gerald Lucovsky, "Silicon Oxide/Silicon Nitride Dual-Layer Films: A Stacked Gate Dielectric for the 21$^{st}$ Century", Journal of Non-Crystalline Solids, (1999), pp. 26-37, vol. 254, Elsevier Science B.V.

(Continued)

*Primary Examiner*—Howard Weiss
*Assistant Examiner*—Steven H Rao
(74) *Attorney, Agent, or Firm*—Crowell & Moring LLP

(57) ABSTRACT

In a film formation method of a semiconductor device including a plurality of silicon-based transistors or capacitors, there exist hydrogen at least in a part of the silicon surface in advance, and the film formation method removes the hydrogen by exposing the silicon surface to a first inert gas plasma. Thereafter a silicon compound layer is formed on the surface of the silicon gas by generating plasma while using a mixed gas of a second inert gas and one or more gaseous molecules, such that there is formed a silicon compound layer containing at least a pat of the elements constituting the gaseous molecules, on the surface of the silicon gas.

6 Claims, 34 Drawing Sheets

U.S. PATENT DOCUMENTS 6,399,520 B1 * 6/2002 Kawakami et al. .......... 438/778
2005/0212119 A1 9/2005 Shero et al.

FOREIGN PATENT DOCUMENTS

| EP | 0 886 308 A2 | 12/1998 |
| EP | 1 030 362 A2 | 8/2000 |
| EP | 1 071 123 A1 | 1/2001 |
| JP | 03-212938 | 9/1991 |
| JP | 06-268234 | 9/1994 |
| JP | 11-279773 A | 10/1999 |
| JP | 2000-091331 | 3/2000 |
| JP | 2000-260767 | 9/2000 |
| JP | 2000-315790 | 11/2000 |
| WO | WO 98/28465 A1 | 7/1998 |

OTHER PUBLICATIONS

European Office Action dated Jun. 12, 2008 (five (5) pages).

* cited by examiner

METHOD OF FORMING A DIELECTRIC FILM THAT CONTAINS SILICON, OXYGEN AND NITROGEN AND METHOD OF FABRICATING A SEMICONDUCTOR DEVICE THAT USES SUCH A DIELECTRIC FILM

CROSS-REFERENCE TO RELATED APPLICATIONS

This application is a divisional of U.S. patent application Ser. No. 10/451,925 filed Jun. 27, 2003 which is a national phase of PCT/JP01/11596 filed Dec. 27, 2001, which claims priority to Japanese patent application Serial no. 2000-402834 filed Dec. 28, 2000 and Japanese patent application Serial no. 2001-094246 filed Mar. 28, 2001.

BACKGROUND OF THE INVENTION

The present invention relates to a semiconductor device in which an oxide film, a nitride film, an oxynitride film, and the like, is formed on a silicon semiconductor, and the formation method thereof.

The gate insulation film of a MIS (metal/insulator/silicon) transistor is required to have various high-performance electric properties and also high reliability, such as low leakage current characteristic, low interface state density, high breakdown voltage, high resistance against hot carriers, uniform threshold voltage characteristic, and the like.

In order to satisfy these various requirements, thermal oxidation has been used conventionally as the formation technology of the gate insulation film, wherein thermal oxidation uses oxygen molecules or water molecules at a temperature of about 800° C. or more.

It should be noted that thermal oxidation has been conducted conventionally after preprocessing to remove surface contaminants such as organic materials, metals, particles, and the like, by cleaning. It should be noted that such a conventional cleaning process includes a final cleaning process that uses a diluted hydrofluoric acid or hydrogenated water for terminating the dangling bonds exiting on the silicon surface by hydrogen. Thereby, formation of a native oxide film on the silicon surface is suppressed, and the silicon substrate thus having a cleaned surface is forwarded to the following process of thermal oxidation. In the thermal oxidation process, the terminating hydrogen at the surface undergoes decoupling during the raising of the temperature of the silicon substrate in an inert gas atmosphere such as argon (Ar). Oxidation of the silicon surface is conducted thereafter at a temperature of about 800° C. or more in an atmosphere in which oxygen molecules or water molecules are introduced.

In the conventional thermal oxidation process, satisfactory oxide/silicon interface characteristics, oxide breakdown characteristics, leakage current characteristics, and the like, are achieved only when a silicon surface having the <100> orientation is used for the formation of the silicon oxide film. Further, it is known that there arises a remarkable deterioration of leakage characteristics when the thickness of the silicon oxide film thus formed by the conventional thermal oxidation process is reduced to about 2 nm or less. Thus, it has been difficult to realize a high-performance miniaturized transistor that requires decrease of the gate insulation film thickness.

Further, when the silicon oxide film is formed on a silicon crystal having a surface orientation other than the <100> orientation or on a polysilicon formed on an insulation film, there arises a problem of formation of large interface state density at the oxide/silicon interface as compared with when the silicon oxide film is formed on the <100>-oriented silicon surface, and this holds true even when the silicon oxide film is formed by thermal oxidation. It should be noted that a polysilicon film formed on an insulation film has a primarily <111> oriented surface. Thus, such a silicon oxide film has poor electric properties in terms of breakdown characteristics, leakage current characteristics, and the like, particularly when the thickness thereof is reduced, and there has been a need of increasing the film thickness of the silicon oxide film when using such a silicon oxide film.

Meanwhile, the use of a large-diameter silicon wafer substrate or large-area glass substrate is increasing these days for improving the efficiency of semiconductor device production. In order to form transistors on the entire surface of such a large-size substrate with uniform characteristics and with high throughput, it is necessary to form the insulation film at a low temperature so as to decrease the magnitude of the temperature change, which takes place at the time of the heating process or at the time of the cooling process. Further, the process of forming such an insulation film is required to have small temperature dependence. In the conventional thermal oxidation process, it should be noted that there has been a large fluctuation of oxidation reaction rate caused by temperature fluctuation, and it has been difficult to conduct the production process of semiconductor devices with high throughput while using a large-area substrate.

In order to solve these problems associated with the conventional thermal oxidation technology, various low-temperature film formation processes have been attempted. Among others, the technology disclosed in Japanese Laid-Open Patent Publication 11-279773 or the technology disclosed in Technical Digest of International Electron Devices Meeting, 1999, pp. 249-252, or in 2000 Symposium on VLSI Technology Digest of Technical Papers, pp. 76-177, achieves relatively good electronic properties for the film by conducting the oxidation of the silicon surface by using atomic state oxygen O*. There, an inert gas having a large metastable level is used for the atomization of the oxygen molecules, and for this, the inert gas is introduced into plasma together with gaseous oxygen molecules.

In these technologies, it should be noted that a microwave is irradiated to the mixed gas formed of an inert krypton (Kr) gas and an oxygen ($O_2$) gas, and a large amount of atomic state oxygen O* is formed. Thereby, the oxidation of silicon is conducted at a temperature of about 400° C., and the properties comparable to those of conventional thermal oxidation, such as low leakage current characteristics, low interface state density high breakdown voltage, and the like, are achieved. Further, according to this oxidation technology, a high-quality oxide film is obtained also on the silicon surface having a surface orientation other than the <100> surface.

On the other hand, such conventional silicon oxide film formation, even when using the microwave plasma, could at best realize a silicon oxide film having electric properties comparable to those of the film formed by conventional thermal oxidation, which uses oxygen molecules or water molecules. Particularly, it has not been possible to obtain the desired low leakage current characteristics in the case the silicon oxide film has a thickness of about 2 nm or less on the silicon substrate surface. Thus, it has been difficult to realize high-performance, miniaturized transistors that require a further decrease of the gate insulation film thickness, similarly to the case of conventional thermal oxide film formation technology.

Further, there has been a problem that the silicon oxide film thus formed shows severe degradation of electric properties in the case the silicon oxide film is used for a transistor, such as degradation of conductance caused by hot carrier injection or increase of leakage current in the case the silicon oxide film is used in a device such as a flash memory, which relies upon tunneling of electrons caused through the silicon oxide film, as compared with the case of using a silicon oxide film formed by the conventional thermal processes.

FIG. 1 shows the schematic structure of a conventional flash memory device 10.

Referring to FIG. 1, the flash memory device 10 is formed on a silicon substrate 11 doped to p-type or n-type and there is formed a floating gate electrode 13 on the silicon substrate 11 via a tunneling oxide film 12. The floating gate electrode 13 is covered with an inter-electrode insulation film 14, and a control gate electrode 15 is formed on the floating gate electrode 13 via the inter-electrode insulation film 14. Further, a source region 11B and a drain region 11C of n-type or p-type are formed in the silicon substrate 11 at both lateral sides of a channel region 11A right underneath the floating gate electrode 13.

In the flash memory device 10 of FIG. 1, the control gate electrode 15 causes capacitance coupling with the floating gate electrode via the inter-electrode insulation film 14, and as a result, the potential of the floating gate electrode is controlled by the control voltage applied to the control gate electrode 15.

Thus, in the case information is written into the floating gate electrode in the flash memory device 10 of FIG. 1, a predetermined drive voltage is applied across the drain region 11C and the source region 11B and a predetermined positive write voltage is applied to the control gate electrode 15. Thereby, there are formed hot electrons as a result of acceleration in the vicinity of the drain region 11C, and the hot electrons thus formed are injected into the floating gate electrode 13 via the tunneling oxide film 12.

In the case the information thus written is to be erased, a predetermined erase voltage is applied to the silicon substrate 11 or to the source region 11B, and the electrons in the floating gate electrode 13 are pulled out. In the case of reading the written information, a predetermined read voltage is applied to the control gate electrode 15 and the electron current flowing through the channel region 11A from the source region 11B to the drain region 11C is detected.

FIG. 2A shows the band structure of the flash memory 10 of FIG. 1 in the cross-sectional view that includes the floating gate electrode 13, the tunneling oxide film 12 and the silicon substrate 11, wherein FIG. 2A shows the state in which no control voltage is applied to the control gate electrode 15.

Referring to FIG. 2A, the tunneling insulation film 12 forms a potential barrier and it can be seen that the injection of the electrons on the conduction band Ec of the silicon substrate 11 into the floating gate electrode 13 is effectively blocked.

FIG. 2B shows the band structure for the case a write voltage is applied to the control gate electrode 15.

Referring to FIG. 2B, there is induced modification of the band structure in the tunneling insulation film 12 as a result of application of the write voltage, and as a result, the conduction band Ec forms a triangular potential. Thus, the hot electrons thus formed in the channel region A are injected into the floating gate electrode 13 after passing through the triangular potential barrier in the form of Fowler-Nordheim tunneling current.

Now, in order to increase the writing speed in the flash memory device 10, there is a need of increasing the tunneling probability of the tunneling current passing through the triangular potential in the state of FIG. 2B. This can be achieved by decreasing the thickness of the tunneling oxide film 12. In the case the thickness of the tunneling oxide film 12 is decreased, on the other hand, the electrons in the channel may pass through the tunneling oxide film 12 in the non-writing state shown in FIG. 2B by causing tunneling and form a leakage current.

FIG. 3 shows the relationship between the electric field applied to the tunneling oxide film 12 and the current density of the tunneling current passing through the tunneling oxide film 12.

Referring to FIG. 3, it is required that a tunneling current of about 1 A/cm$^2$ can flow through the tunneling oxide film 12 in response to an electric field of about 10 MV/cm applied to the tunneling oxide film 12 in the writing state of FIG. 2B when to realize the writing time of 1-10µ seconds in the flash memory device 10. In the case of non-writing state of FIG. 2A, on the other hand, it is required that the leakage current through the tunneling oxide film 12 be suppressed to $10^{-15}$ A/cm$^2$ or less at the application electric filed of 1 MV/cm$^2$. Thus, the conventional flash memory device 10 realizes the electric field—current characteristic shown in FIG. 3 by a straight line by using a thermal oxide film having a thickness of several nanometers for the tunneling oxide film 12.

On the other hand, when an attempt is made to reduce the thickness of the tunneling oxide film 12 for reducing the write time, the electric field—current characteristic of the tunneling oxide film 12 is changed as represented in FIG. 3 by a curved line. There, it can be seen that, while there is caused a large increase of the tunneling current in the case the electric field of 10 MV/cm is applied, and while the conventional tunneling current density of 1 A/cm$^2$ is realized in the state of low electric field, there is caused a large increase in the leakage current in the non-writing state, and thus, the information written into the floating gate electrode 13 is no longer retained.

SUMMARY OF THE INVENTION

Accordingly, it is a general object of the present invention to provide a novel and useful semiconductor device and fabrication process thereof wherein the foregoing problems are eliminated.

Another object of the present invention is to provide a dielectric film showing a small leakage current and is capable of providing a tunneling current of large current density at the time of application of an electric field, as well as a formation method thereof.

Another object of the present invention is to provide a semiconductor device or a non-volatile semiconductor device that uses such a dielectric film and a fabrication method of such a semiconductor device.

Another object of the present invention is to provide a dielectric film formed on a silicon surface, said dielectric film containing nitrogen with a concentration distribution such that a nitrogen concentration increases at a dielectric film surface as compared to a central part of the dielectric film.

Another object of the present invention is to provide a semiconductor device, comprising:

a silicon substrate;

an insulation film formed on said silicon substrate; and an electrode formed on said insulation film, wherein said insulation film has a nitrogen concentration distribution such that a nitrogen concentration increases at a film surface contacting with said electrode as compared with a central part of said film.

Another object of the present invention is to provide a non-volatile semiconductor memory device, comprising:

a silicon substrate;

a tunneling insulation film formed on said silicon substrate;

a floating gate electrode formed on said tunneling insulation film; and a control gate electrode formed on said floating gate electrode via an inter-electrode insulation film, one of said insulation films having a nitrogen concentration distribution such that a nitrogen concentration increases at the film surface contacting with said electrode as compared with a central part of said film.

Another object of the present invention is to provide a method of forming a dielectric film, comprising the steps of:

forming a silicon oxide film on a surface;

modifying a surface of said silicon oxide film by exposing the same to hydrogen nitride radicals NH*.

Another object of the present invention is to provide a method of forming a dielectric film, comprising the steps of:

forming a silicon oxide film on a surface; and modifying a surface of said silicon oxide film by exposing the same to microwave plasma formed in a mixed gas of an inert gas selected from Ar or Kr and a gas containing nitrogen and hydrogen as constituent elements.

Another object of the present invention is to provide a method of forming a dielectric film comprising the step of exposing a silicon surface to microwave plasma formed in a mixed gas of an inert gas primarily formed of Kr, a gas containing nitrogen as a constituent element and a gas containing oxygen as a constituent element, to form an oxynitride film on said silicon surface.

Another object of the present invention is to provide a method of fabricating a semiconductor device, comprising the steps of:

forming a silicon oxide film on a silicon substrate by an oxidation processing;

modifying a surface of said silicon oxide film by exposing the same to hydrogen nitride radicals NH*; and forming a gate electrode on said modified silicon oxide film.

Another object of the present invention is to provide a method of fabricating a semiconductor device, comprising the steps of:

forming a silicon oxide film on a silicon substrate by an oxidation processing;

modifying a surface of said silicon oxide film by exposing the same to microwave plasma formed in a mixed gas of an inert gas selected from Ar or Kr and a gas containing nitrogen and hydrogen as constituent elements; and forming a gate electrode on said modified silicon oxide film.

Another object of the present invention is to provide a fabrication method of a semiconductor device, comprising the steps of:

exposing a silicon substrate surface to microwave plasma formed in a mixed gas of an inert gas primarily formed of Kr, a gas containing nitrogen as a constituent element and a gas containing oxygen as a constituent element, to form an oxynitride film on said silicon surface; and forming a gate electrode on said oxynitride film.

According to the present invention, the surface of the oxide film is modified by exposing the surface of the oxide film formed on a surface of a silicon substrate or the like to microwave plasma formed in a mixed gas of an inert gas primarily formed of Ar or Kr and a gas containing nitrogen and hydrogen, and nitrogen are concentrated to a surface region of the oxide film within the depth of several nanometers. Nitrogen thus concentrated to the oxide film surface forms a substantially layered nitride region on the oxide film surface, and as a result, the oxide film is changed to a structure approximately similar to the one in which a nitride film is laminated on the surface of the silicon oxide film.

In the dielectric film having such a structure, there is provided a region of small bandgap in correspondence to the nitride region adjacent to a region of large bandgap corresponding to the silicon oxide film region, and because of the fact that the nitride region has a specific dielectric constant larger than that of the silicon oxide film, the dielectric film structure shows an effectively large film thickness with regard to the electrons in the channel region 11A in the state that no control voltage is applied to the control gate electrode 15, and the tunneling of the electrons is effectively blocked.

When a write voltage is applied to the control gate electrode 15, on the other hand, the band structures of the oxide film region and the nitride region constituting the dielectric film structure are changed. Thereby, the effective thickness of the oxide film region is reduced with the formation of the nitride region, and as a result, the hot electrons in the channel region 11A are allowed to cause tunneling through the dielectric film structure efficiently. Because the nitride region formed on the surface of the oxide film region has a small bandgap, it does not function as a potential barrier to the hot electrons to be injected.

As a result of using such a dielectric film structure for the tunneling insulation film of the non-volatile semiconductor memory device such as a flash memory, and the like, it becomes possible to increase the wiring speed or reduce the operational voltage while simultaneously reducing the leakage current.

It should be noted that such an oxide film, in which there is caused nitrogen concentration at the surface part thereof, can be formed also by exposing the silicon surface to microwave plasma formed in a mixed gas of an inert gas primarily formed of Kr, a gas containing nitrogen as a constituent element and a gas containing oxygen as a constituent element. The oxide film thus formed has the composition of an oxynitride film as a whole, while it should be noted that a part of the nitrogen is concentrated in such a structure to the interface between the oxynitride film and the silicon surface for relaxing the stress, while other nitrogen is concentrated to the film surface and forms the desired nitride layer region. In the oxynitride film of such a structure, there is caused stress relaxation by the nitrogen concentrated to the interface to the silicon substrate, and because of this, the density of the electric charges trapped in the film or the density of the interface state is reduced and the leakage current path other than the tunneling mechanism is effectively blocked. Thus, the oxynitride film obtained according to such a process has an extremely high film quality. In such an oxynitride film, it is preferable that the hydrogen concentration contained in the film is $10^{12}$ cm$^{-2}$ or less, preferably $10^{11}$ cm$^{-2}$ or less in terms of surface density.

As the formation of the dielectric film can be conducted at a low temperature of 550° C. or less in the present invention, it is possible to recover the oxygen defects in the film without decoupling the hydrogen terminating the dangling bonds in the oxide film. This applies also to the formation of the nitride film or oxynitride film to be explained later.

DETAILED DESCRIPTION OF THE PREFERRED EMBODIMENTS

Hereinafter, various preferable embodiments to which the present invention is applied will be explained in detail with reference to the drawings.

First Embodiment

Figure 4:
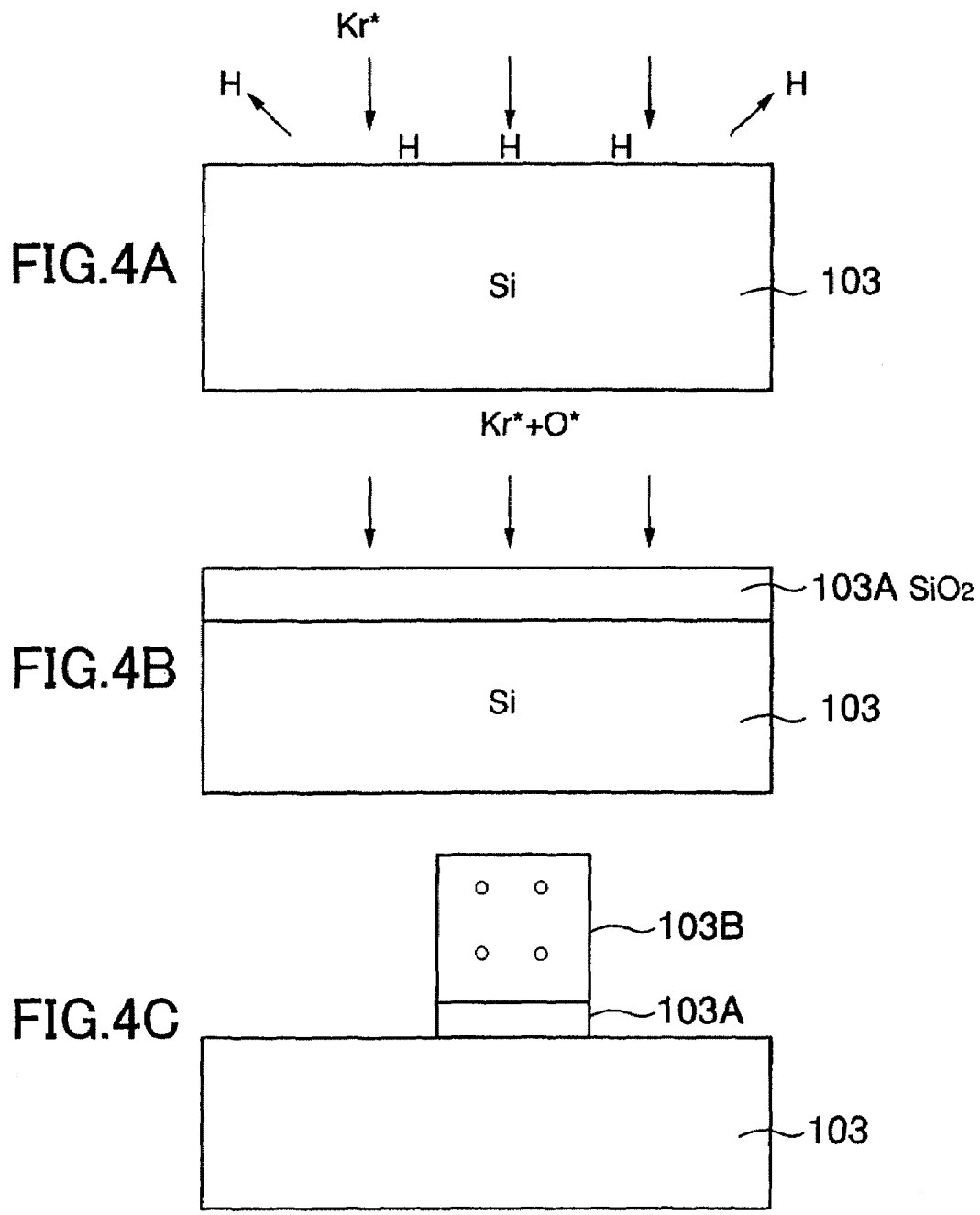
FIGS. 4A-4C are diagrams showing the formation process of an oxide film and the fabrication process of a semiconductor device according to a first embodiment of the present invention.

FIGS. 4A-4C show the low-temperature formation process of an oxide film that uses plasma as well as the fabrication process of a semiconductor device that uses such an oxide film according to a first embodiment of the present invention. Further, FIG. 5 shows an example of a plasma processing apparatus used in the present invention and having a radial line slot antenna in a cross-sectional view.

In the present embodiment, the hydrogen terminating the dangling bonds at a silicon surface is first removed in the step of FIG. 4A. More specifically, the removal process of the surface-terminating hydrogen and the oxidation process are conducted in the same processing chamber continuously, and the Kr gas, which is used for the plasma excitation gas in the subsequent oxide film formation process, is used in the removal process of the surface-terminating hydrogen.

Figure 5:
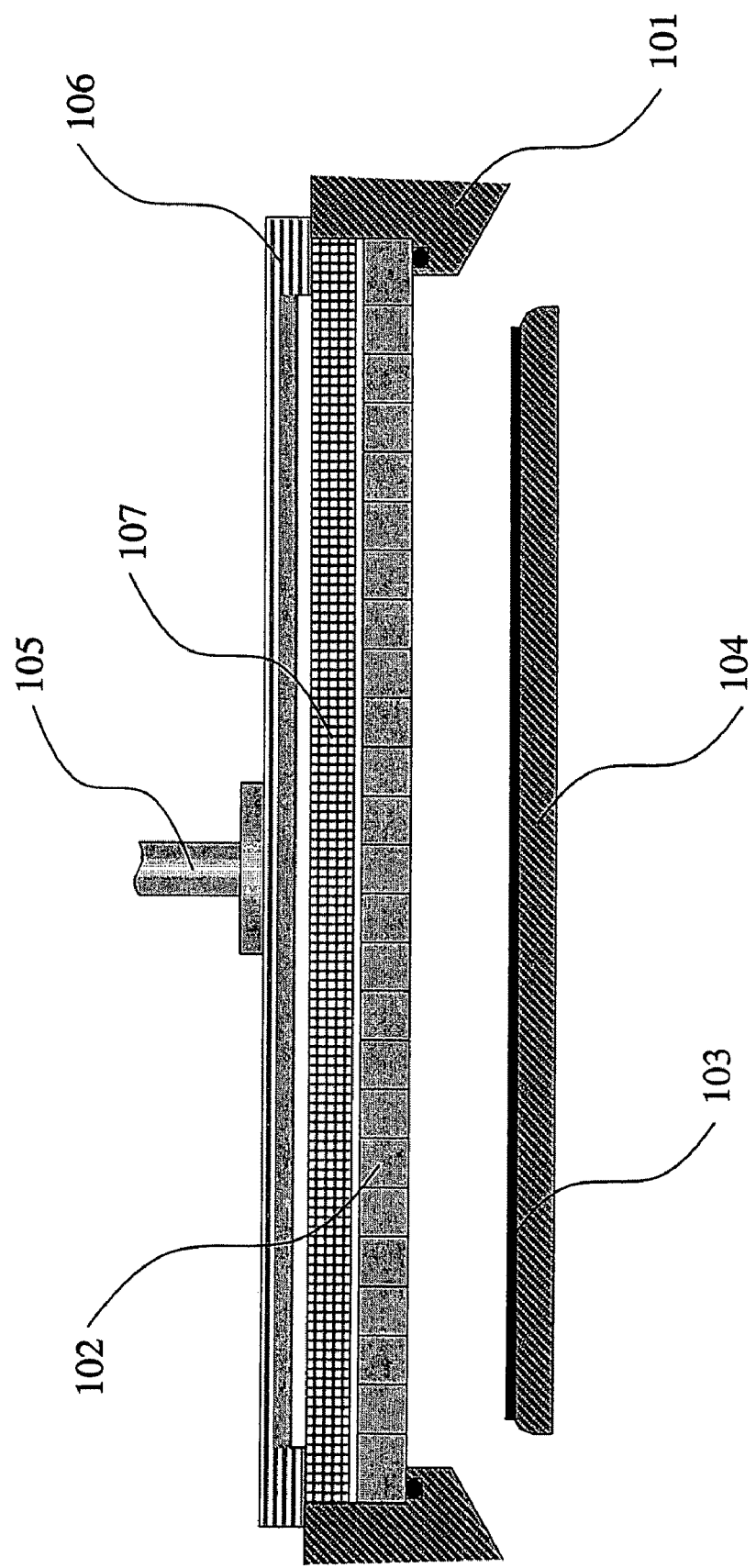
FIG. 5 is a diagram showing the schematic construction of a plasma apparatus having a radial line slot antenna and used in the present invention.

First, a vacuum vessel (processing chamber) 101 is evacuated in the plasma processing apparatus of FIG. 5 and an Ar gas is introduced first from a shower plate 102. Then, the gas is changed to the Kr gas. Further, the pressure inside the processing chamber 101 is set to about 133 Pa (1 Torr).

Next, a silicon substrate 103 is placed on a stage 104 having a heating mechanism, and the temperature of the specimen is set to about 400° C. As long as the temperature of the silicon substrate 103 is in the range of 200-500° C., the same results as explained below are obtained. It should be noted that the silicon substrate 103 is subjected to treatment in diluted hydrofluoric acid in the preprocessing step immediately before, and as a result, the dangling bonds on the surface of the silicon substrate are terminated by hydrogen.

Next, a microwave of 2.45 GHz is supplied to a radial line slot antenna 106 from a coaxial waveguide 105 with the frequency of 2.45 GHz, wherein the microwave thus supplied is introduced into the processing chamber 101 from the radial line slot antenna 106 through a dielectric plate 107 provided on a part of the wall of the processing chamber 101. The microwaves thus introduced cause excitation of the Kr gas introduced into the processing chamber 101 from the shower plate 102, and as a result, there is induced a high-density Kr plasma right underneath the shower plate 102. As long as the frequency of the microwaves thus supplied is in the range of about 900 MHz or more but not exceeding about 100 GHz, almost the same results as explained below are obtained.

In the construction of FIG. 5, the separation between the shower plate 102 and the substrate 103 is set to 6 cm in the present embodiment. The smaller the gap separation, the film formation rate becomes faster. Further, while the present embodiment shows an example of film formation by using a plasma apparatus that uses a radial line slot antenna, it should be noted that the plasma may be induced by introducing the microwave into the processing chamber by other ways.

By exposing the silicon substrate 103 to the plasma thus excited by the Kr gas, the surface of the silicon substrate 103 experiences bombardment of low energy Kr ions, and as a result, the surface-terminating hydrogens are removed.

Figure 6:
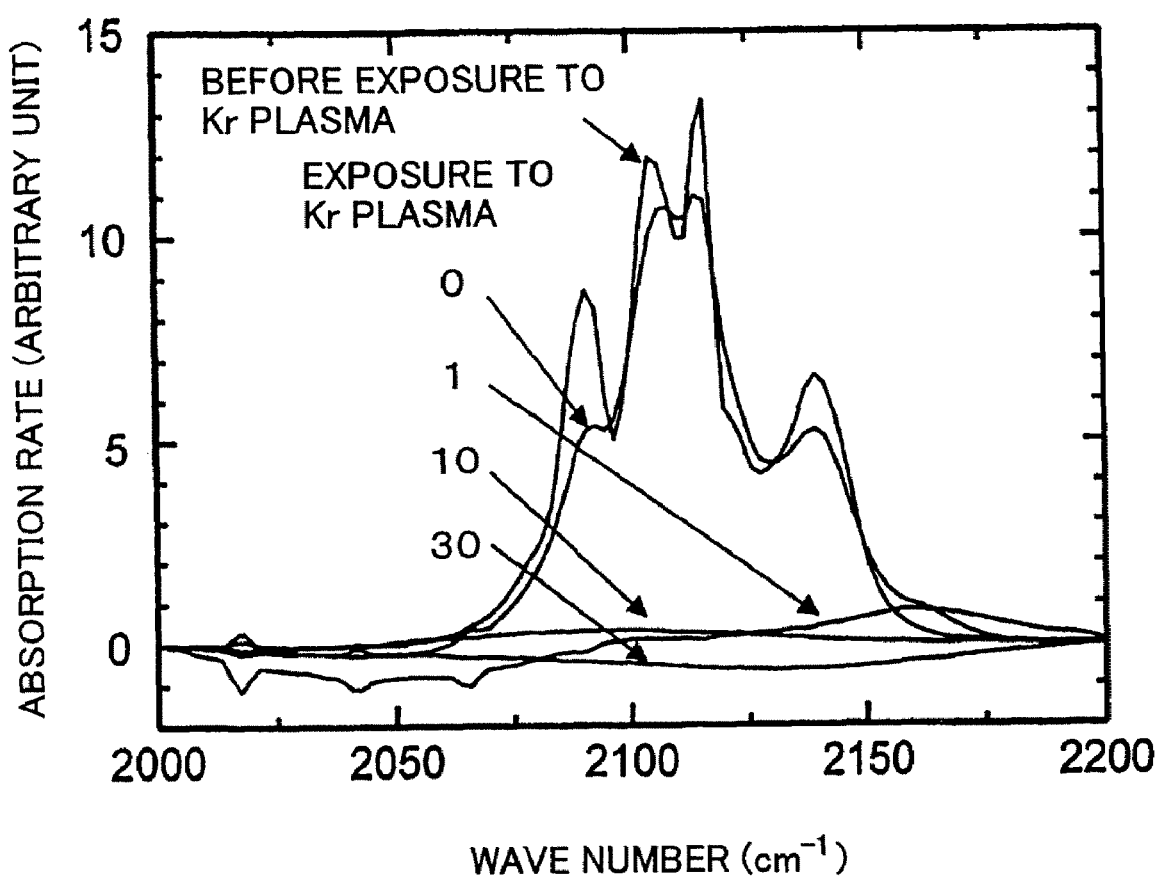
FIG. 6 is a characteristic diagram showing the exposure effect of the bond formed between the surface-terminating hydrogen at the silicon surface and silicon caused by exposure to Kr plasma as obtained by infrared spectroscopy.

FIG. 6 shows the result of analysis of the silicon-hydrogen bond on the surface of the silicon substrate 103 by means of infrared spectrometer and shows the effect of removal of the surface-terminating hydrogen at the silicon surface by the Kr plasma induced by introducing the microwave into the processing chamber 101 under a pressure of 133 Pa (1 Torr) with a power of 1.2 W/cm$^2$.

Referring to FIG. 6, it can be seen that the optical absorption at about 2100 cm$^{-1}$, which is characteristic to the silicon-hydrogen bond, is more or less gone after the Kr plasma radiation conducted for only 1 second. Further, after continuous irradiation for thirty seconds, this optical absorption is almost completely gone. This means the surface-terminating hydrogen on the silicon surface can be removed by the Kr plasma irradiation conducted for about 30 seconds. In the present embodiment, the surface-terminating hydrogen is completely removed by conducting the Kr plasma irradiation for 1 minute.

Next, in the step of FIG. 4B, a Kr/O$_2$ mixed gas is introduced from the shower plate 102 with a partial pressure ratio of 97/3. Thereby, the pressure of the processing chamber is maintained at about 133 Pa (1 Torr). In the high-density excitation plasma in which the Kr gas and the O$_2$ gas are mixed, Kr* in the intermediate excitation state and the O$_2$ molecules cause collision and there is caused efficient formation of atomic state oxygen O* in a large amount.

In the present embodiment, the atomic state oxygen O* thus formed is used for oxidizing the surface of the silicon substrate 103, and as a result, there is formed an oxide film 103A. In the thermal oxidation process conducted conventionally on a silicon surface, the oxidation is caused by the O$_2$ molecules or H$_2$O molecules and a very high temperature of 800° C. or more has been needed. In the oxidation processing of the present invention conducted by the atomic state oxygen O*, the oxidation becomes possible at a very low temperature of about 400° C. In order to facilitate the collision of Kr* and O$_2$, it is preferable to use a high pressure for the pressure of the processing chamber. However, the use of excessively high pressure facilitates mutual collision of O* thus formed, and the atomic state oxygen O* thus formed is returned to the O$_2$ molecules. Thus, there exists an optimum gas pressure.

Figure 7:
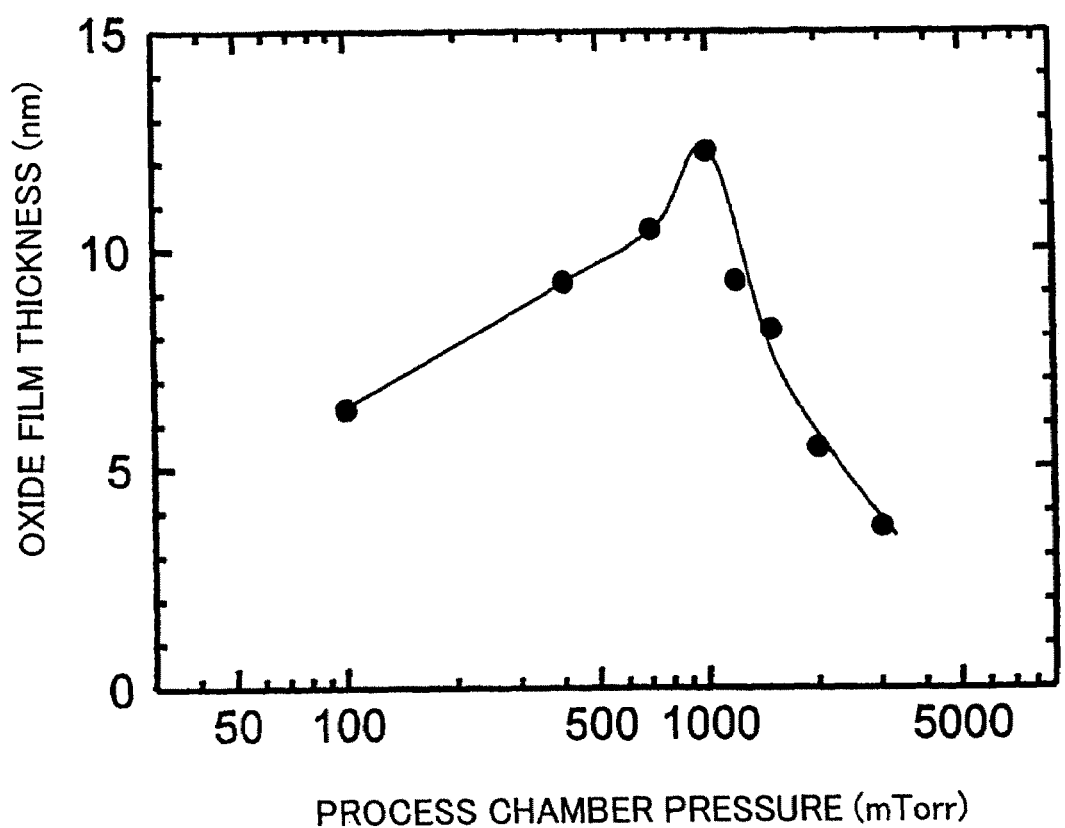
FIG. 7 is a characteristic diagram showing the dependence of silicon oxide film thickness on the gas pressure of the processing chamber.

FIG. 7 shows the relationship between the thicknesses of the oxide film 103A thus formed and the internal pressure of the processing chamber for the case the pressure inside the processing chamber 101 is changed while maintaining the Kr/O$_2$ pressure ratio to 97/3. In FIG. 7, the temperature of the silicon substrate 103 is set to 400° C. and the oxidation processing is conducted for 10 minutes.

Referring to FIG. 7, it can be seen that the oxidation rate becomes maximum when the pressure inside the processing chamber 101 is about 133 Pa (1 Torr) and that this pressure or the pressure condition near this is the optimum condition. This optimum pressure is not limited to the case in which the silicon substrate 103 has the <100> surface orientation but is valid also in other cases in which the silicon surface has any other surface orientation.

After the silicon oxide film 103A is thus formed to the desired film thickness, the introduction of the microwave power is shut down and the plasma excitation is terminated. Further, the Kr/O$_2$ mixed gas is replaced with Ar gas, and with this, the oxidation processing is terminated. It should be noted that the use of Ar gas before and after the foregoing step is intended to enable the use of low-cost Ar gas which is cheaper than Kr for the purging gas. The Kr gas used in the present step is recovered and reused.

Following the foregoing oxide film formation process, the gate electrode 103B is formed on the oxide film 103A, and a semiconductor integrated circuit device including transistors and capacitors is formed after conducting various patterning, ion implantation, passivation film formation, hydrogen sintering, and the like.

The result of measurement of hydrogen content in the silicon oxide film formed according to the foregoing process indicates that the hydrogen content is about $10^{22}$/cm$^2$ or less in terms of surface density when the silicon oxide film has a thickness of 3 nm, wherein it should be noted that the foregoing measurement was conducted by measuring the hydrogen release caused with temperature rise. Particularly, it was confirmed that the oxide film characterized by a small leakage current shows that the hydrogen content in the silicon oxide film is about $10^{11}$/cm$^2$ or less in terms of surface density. On the other hand, the oxide film not exposed to the Kr plasma before the oxide film formation contained hydrogen with a surface density exceeding $10^{12}$/cm$^2$.

Further, a comparison was made on the roughness of the silicon surface before and after the oxide film formation conducted according to the process noted before wherein the measurement of the surface roughness was made by using an atomic force microscope. It should be noted that the silicon surface was exposed after the oxide film formation, by removing the silicon oxide film thus formed. It was confirmed that no change of surface roughness is caused. Thus, no roughening of silicon surface is caused even when the oxidation processing is conducted after the removal of the surface-terminating hydrogen.

Figure 8:
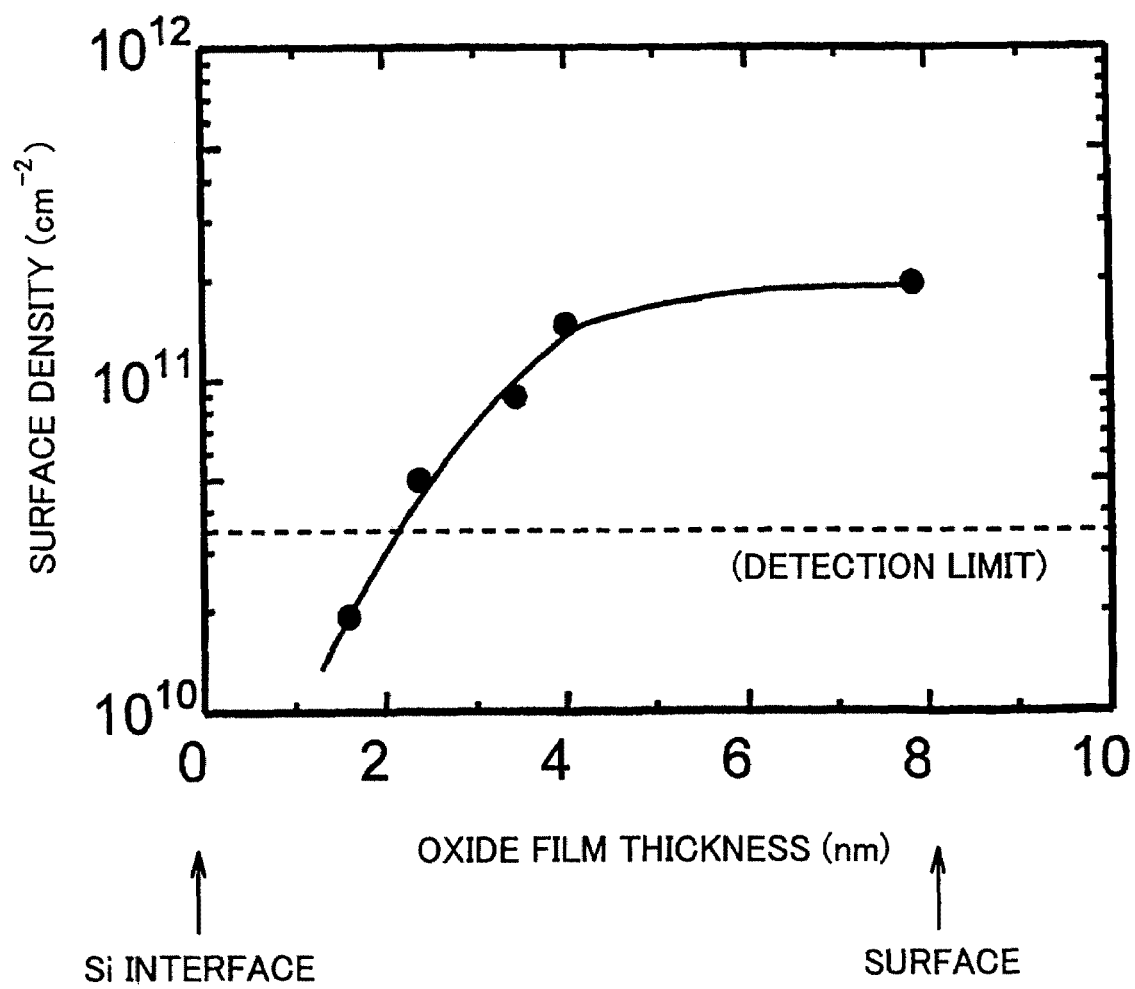
FIG. 8 is a characteristic diagram showing the depth distribution profile of the Kr density ion the silicon oxide film.

FIG. 8 shows the depth profile of Kr density in the silicon oxide film formed according to the foregoing process as measured by the total reflection X-ray fluorescent spectrometer. It should be noted that FIG. 7 shows the result for the silicon <100> surface, while this result is not limited to the (100) surface and a similar result is obtained also in other surface orientations.

In the experiment of FIG. 8, the partial pressure of oxygen in Kr is set to 3% and the pressure of the processing chamber is set to 133 Pa (133 Torr). Further, the plasma oxidation processing is conducted at the substrate temperature of 400° C.

Referring to FIG. 8, the Kr density in the silicon oxide film increases with increasing distance from the silicon surface and reaches a value of about $2 \times 10^{11}$/cm$^2$ at the surface of the silicon oxide film. This indicates that the silicon oxide film obtained according to the foregoing processing is a film in which the Kr concentration is constant in the film in the region in which the distance to the underlying silicon surface is 4 nm or more and in which the Kr concentration decreases toward the silicon/silicon oxide interface in the region within the distance of 4 nm from the silicon surface.

Figure 9:
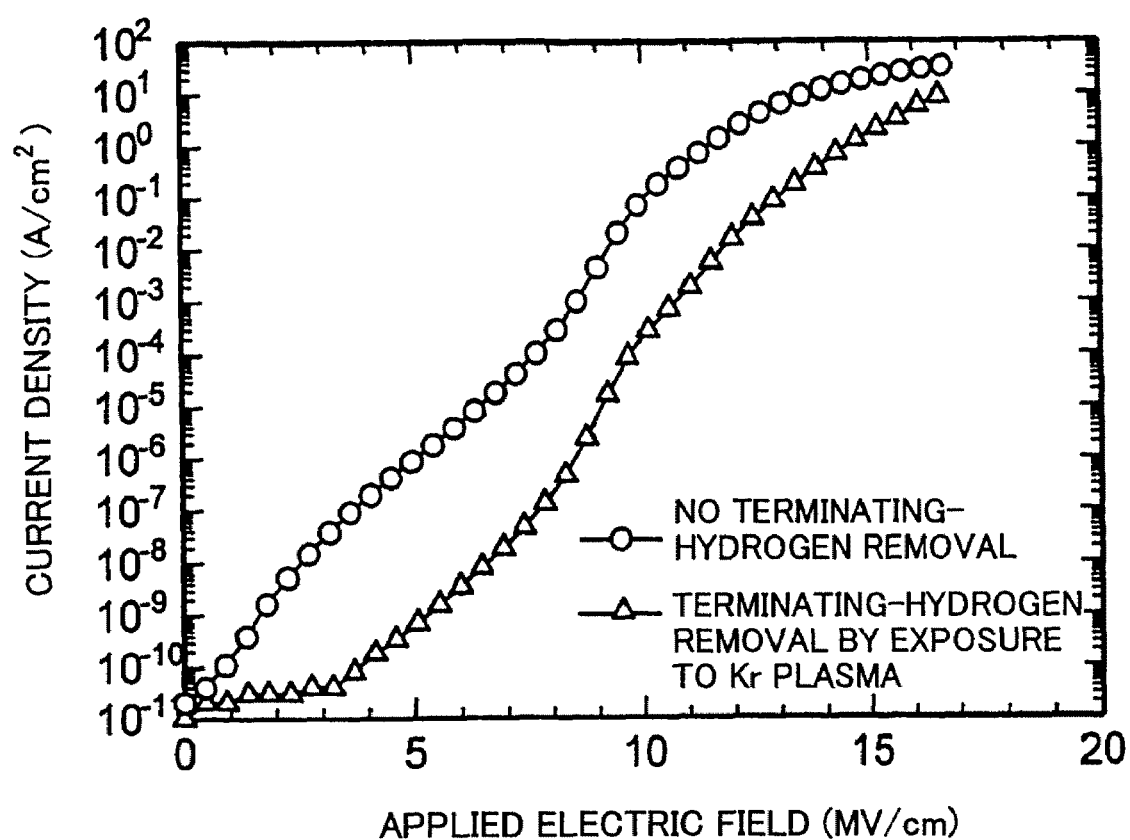
FIG. 9 is a characteristic diagram showing the current versus voltage characteristic of the silicon oxide film.

FIG. 9 shows the dependence of the leakage current on the applied electric field for the silicon oxide film obtained according to the foregoing process. It should be noted that the result of FIG. 9 is for the case in which the thickness of the silicon oxide film is 4.4 nm. For the purpose of comparison, FIG. 9 also shows the leakage current characteristic in which no exposure to the Kr plasma was conducted before the formation of the oxide film.

Referring to FIG. 9, the leakage current characteristic of the silicon oxide film not exposed to the Kr plasma is equivalent to the leakage current characteristic of the conventional thermal oxide film. This means that the $Kr/O_2$ microwave plasma processing does not improve the leakage current characteristics of the oxide film thus obtained very much. On the other hand, when the oxidation is conducted by the present embodiment in which the $Kr/O_2$ gas is introduced after the Kr plasma irradiation processing, it can be seen that the leakage current is improved by the order of 2 or 3 as compared with the leakage current of the silicon oxide film formed by conventional microwave plasma oxidation when measured at the same electric field, indicating that the silicon oxide film formed by the present embodiment has excellent low leakage characteristics. It is further confirmed that a similar improvement of leakage current characteristics is achieved also in the silicon oxide film having a much thinner film thickness of 1.7 nm.

Figure 10:
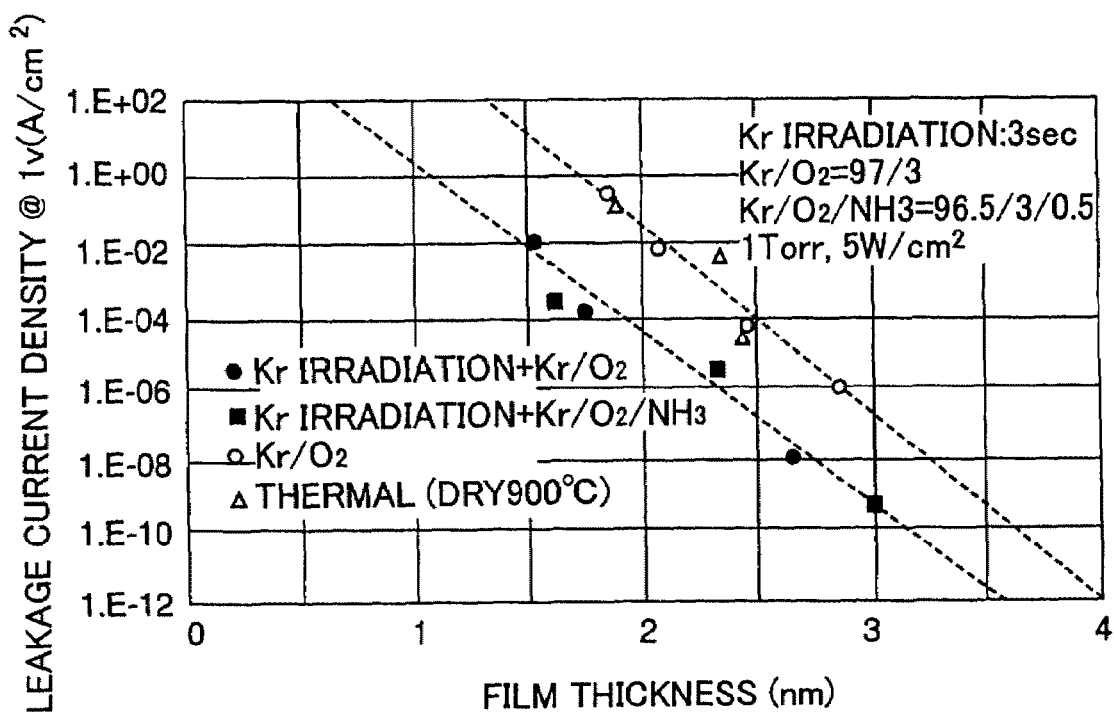
FIG. 10 is a diagram showing the relationship between the leakage current of the silicon oxide film and the silicon oxynitride film and the film thickness.

FIG. 10 shows the result of measurement of the leakage current characteristics of the silicon oxide film of the present embodiment when the thickness of the silicon oxide film is changed variously. In FIG. 10, Δ shows the leakage current characteristic of a conventional thermal oxide film, ○ shows the leakage current characteristic of the silicon oxide film formed by conducting oxidation by the Kr/O2 plasma while omitting the exposure process to the Kr plasma, while ● shows the leakage current characteristic of the silicon oxide film of the present embodiment in which the oxidation is conducted by the $Kr/O_2$ plasma after exposure to the Kr plasma. In FIG. 9, it should be noted that the data represented by ■ shows the leakage current characteristic of an oxynitride film to be explained later.

Referring to FIG. 10, it can be seen that the leakage current characteristic of the silicon oxide film represented by ○ and formed by plasma oxidation while omitting exposure to the Kr plasma coincides with the leakage current characteristic of the thermal oxide film represented by Δ, while it can be seen also that the leakage current characteristics of the silicon oxide film of the present embodiment and represented by ● is reduced with respect to the leakage current characteristics represented by ○ by the order of 2-3. Further, it can be seen that a leakage current of $1\times10^{-2}$ $A/cm^2$, which is comparable to the leakage current of the thermal oxide film having a thickness of 2 nm, is achieved in the silicon oxide film of the present embodiment in the case the oxide film has the thickness of about 1.5 nm.

Further, the measurement of the surface orientation dependence conducted on the silicon/silicon oxide interface state density for the silicon oxide film obtained by the embodiment of the present invention has revealed the fact that a very low interface state density of about $1\times10^{10}$ $cm^{-2}$ $eV^{-1}$ is obtained for any silicon surface of any surface orientation.

Further, the oxide film formed by the present embodiment shows equivalent or superior characteristics as compared with the conventional thermal oxide film with regard to various electric and reliability characteristics such as breakdown characteristics, hot carrier resistance, charge-to-breakdown electric charges QBD, which corresponds to the electric charges up to the failure of the silicon oxide film under a stress current, and the like.

As noted above, it is possible to form a silicon oxide film on a silicon surface of any surface orientation at a low temperature of 400° C. by conducting the silicon oxidation processing by the $Kr/O_2$ high-density plasma after removal of the terminating hydrogen. It is thought that such an effect is achieved because of the reduced hydrogen content in the oxide film caused as a result of the removal of the terminating hydrogen and because of the fact that the oxide film contains Kr. Because of the reduced amount of hydrogen in the oxide film, it is believed that weak element bonding is reduced in the silicon oxide film. Further, because of the incorporation of Kr in the film, the stress inside the film and particularly at the $Si/SiO_2$ interface is relaxed, and there is caused a reduction of trapped electric charges or reduction of interface state density. As a result, the silicon oxide film shows significantly improved electric properties.

Particularly, it is believed that the feature of reducing the hydrogen concentration in the film to the level of $10^{12}/cm^2$ or less, preferably to the level of $10^{11}$ $cm^2$ or less, and the feature of incorporation of Kr into the film with a concentration of $5\times10^{11}/cm^2$ or less are thought as contributing to the improvement of electric properties and reliability of the silicon oxide film.

In order to realize the oxide film of the present invention, it is also possible to use a plasma processing apparatus other than the one shown in FIG. 5, as long as the plasma processing apparatus can conduct the oxide film formation at low temperatures by using plasma. For example, it is possible to use a two-stage shower plate-type plasma processing apparatus in which there are provided a first gas release structure for releasing Kr for plasma excitation by a microwave and a second gas release structure different from the first gas release structure for releasing the oxygen gas.

In the present embodiment, it should be noted that the feeding of the microwave power is shut down upon formation of the silicon oxide film to a desired film thickness, followed by replacing the $Kr/O_2$ mixed gas with the Ar gas. On the other hand, it is also possible to introduce a $Kr/NH_3$ mixed gas from the shower plate 102 with the partial pressure ratio of 98/2 before shutting down the microwave power while maintaining the pressure at about 133 Pa (1 Torr). Thereby, a silicon nitride film of about 0.7 nm thickness is formed on the surface of the silicon oxide film upon termination of the processing. According to such a process, it becomes possible to form an insulation film having a higher specific dielectric constant by forming a silicon oxynitride film in which a silicon nitride film is formed on the surface thereof.

Second Embodiment

Figure 11A:
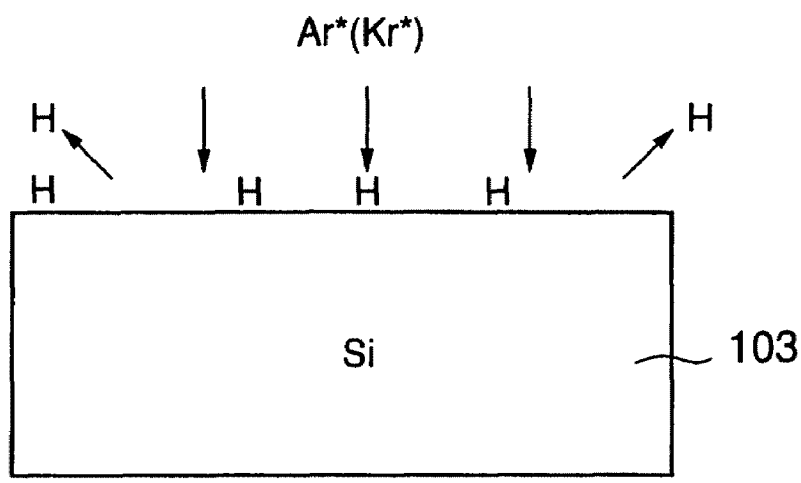
FIGS. 11A-11C are diagrams showing the formation method of a nitride film and a fabrication method of a semiconductor device according to a second embodiment of the present invention.
Figure 11B:
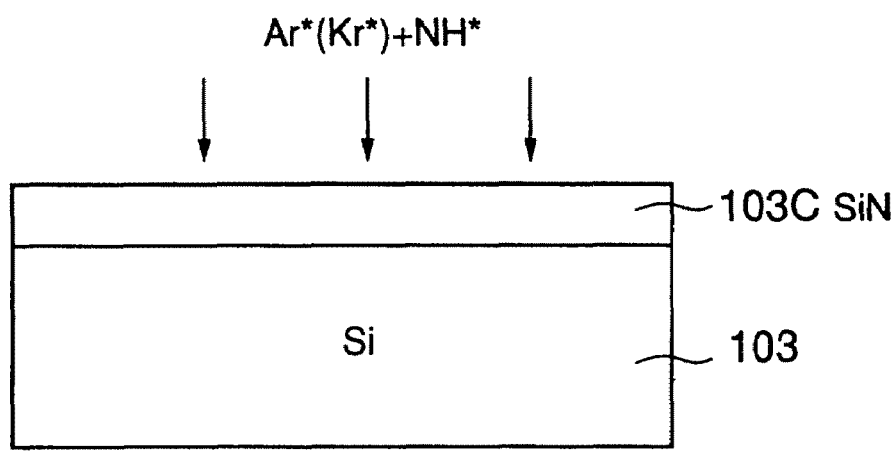
Figure 11C:
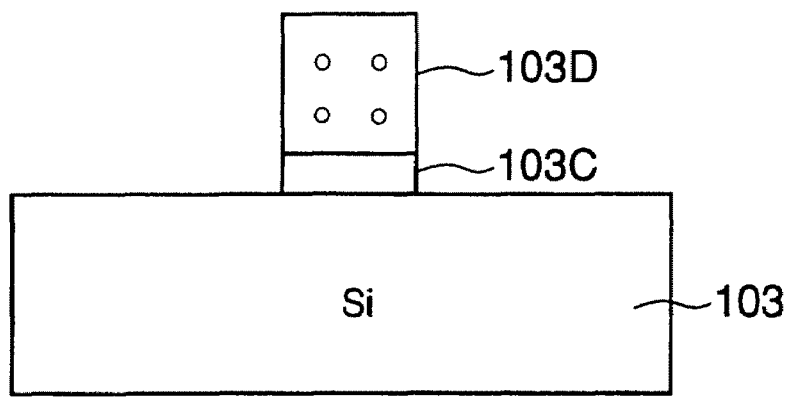

FIGS. 11A-11C show the formation method of a nitride film at low temperature by using plasma according to a second embodiment of the present invention, as well as the fabrication method of a semiconductor device that uses such a nitride film.

In the present embodiment, too, an apparatus similar to the one shown in FIG. 5 is used for the nitride film formation. Further, in the present embodiment, it is preferable to use Ar or Kr for the plasma excitation gas for removing the terminating hydrogen and for the nitride film formation, in order to form a high-quality nitride film.

Hereinafter, an example of using Ar will be represented.

First, the interior of the vacuum vessel (processing chamber) 101 of FIG. 5 is evacuated to a vacuum state in the step of FIG. 11A and an Ar gas is introduced from the shower plate 102 such that the pressure inside the processing chamber is set to about 13.3 Pa (100 mTorr).

Next, a silicon substrate 103 is introduced into the processing chamber 101 and is placed on the stage 104 in which there is provided a heating mechanism, wherein the silicon substrate is subjected to a cleaning process conducted in a hydrogenated water and the silicon dangling bonds at the substrate surface are terminated by hydrogen. Further, the temperature of the specimen is set to 500° C. As long as the temperature is in the range of 300-550° C., results similar to the one described below are obtained.

Next, a microwave of 2.45 GHz is supplied into the processing chamber from the coaxial waveguide 105 via the radial line slot antenna 106 and the dielectric plate 107 and a high-density plasma of Ar is induced in the processing chamber. As long as the frequency of the supplied microwave is in the range of about 900 MHz or more but not exceeding about 10 GHz, results similar to the one described below are obtained. In the present embodiment, the separation between the shower plate 102 and the substrate 103 is set to 6 cm. With decreasing separation, faster deposition rate becomes possible. While the present embodiment shows the example of film formation by a plasma apparatus that uses the radial line slot antenna, it is also possible to introduce the microwave into the processing chamber by other methods.

The silicon surface thus exposed to the excited plasma based on an Ar gas is subjected to bombardment of low energy Ar ions, and the surface-terminating hydrogen are removed as a result. In the present embodiment, the Ar plasma exposure process is conducted for 1 minute.

Next, in the step of FIG. 11B, an $NH_3$ gas is mixed to the Ar gas from the shower plate 102 with a partial pressure ratio of 2%. Thereby, the pressure of the processing chamber is held at about 13.3 Pa (100 mTorr). In high-density plasma in which the Ar gas and the $NH_3$ gas are mixed, there are caused collision of Ar* in the intermediate excited state and the $NH_3$ molecules, and NH* radicals are formed efficiently. The NH* radicals thus formed cause nitridation of the silicon substrate surface, and as a result, there is formed a silicon nitride film 103 on the surface of the silicon substrate 103.

Upon formation of the silicon nitride film 103C with a predetermined thickness, the supply of the microwave power is shut down and the excitation of the plasma is terminated. Finally, the Ar/$NH_3$ mixed gas is replaced with the Ar gas and the nitridation processing is terminated.

Figure 1:
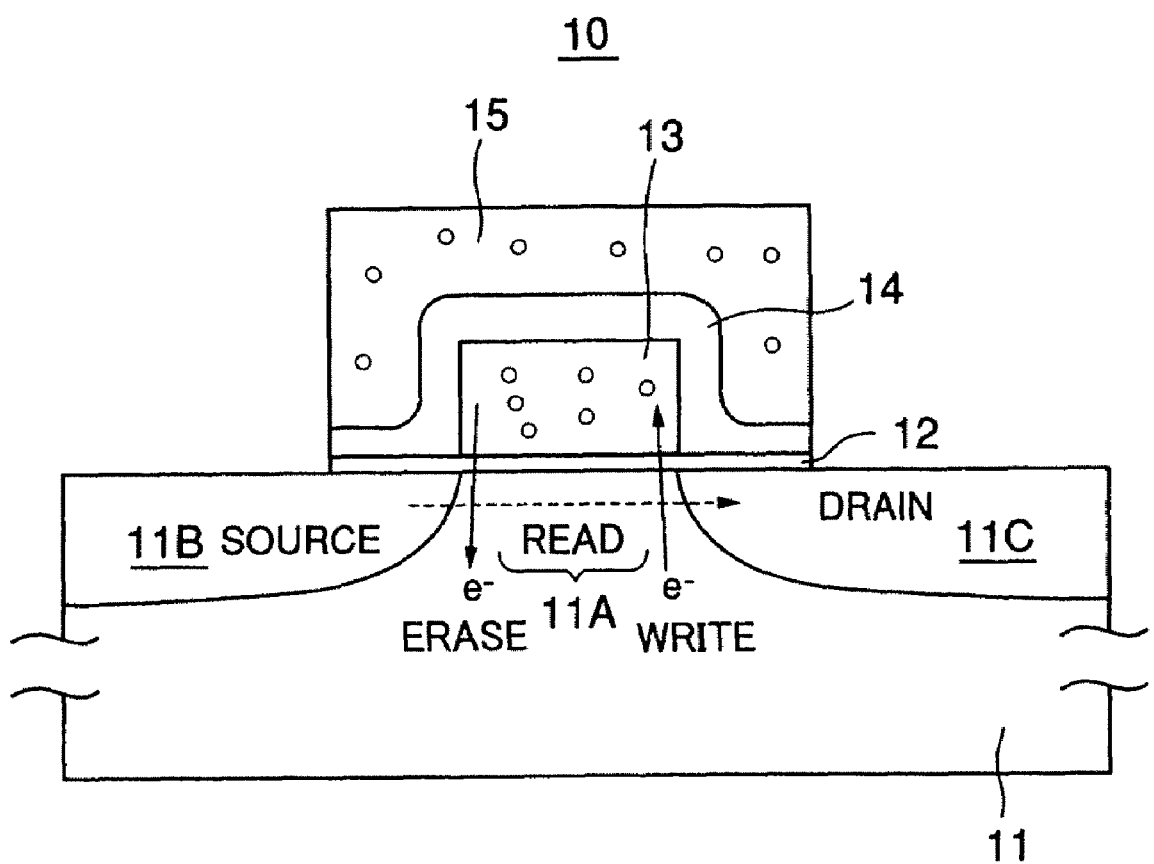
FIG. 1 is a diagram showing the construction of a conventional flash memory device.
Figure 2A:
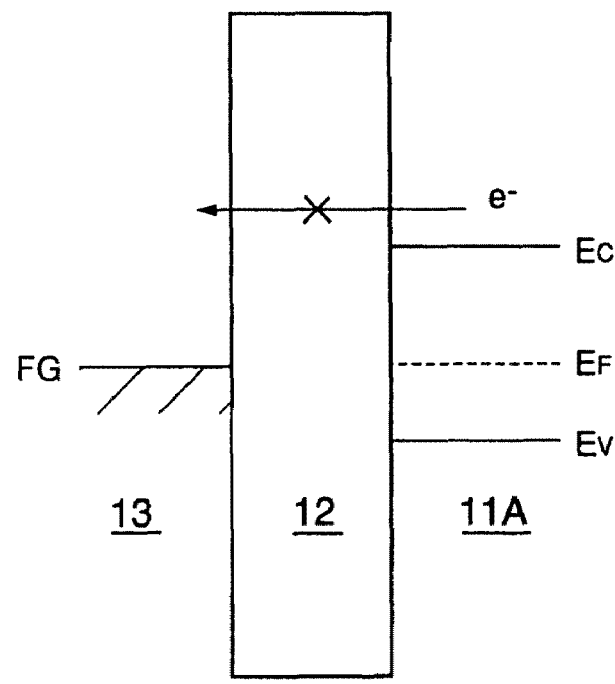
FIGS. 2A and 2B are diagrams explaining the operation of the flash memory device.
Figure 2B:
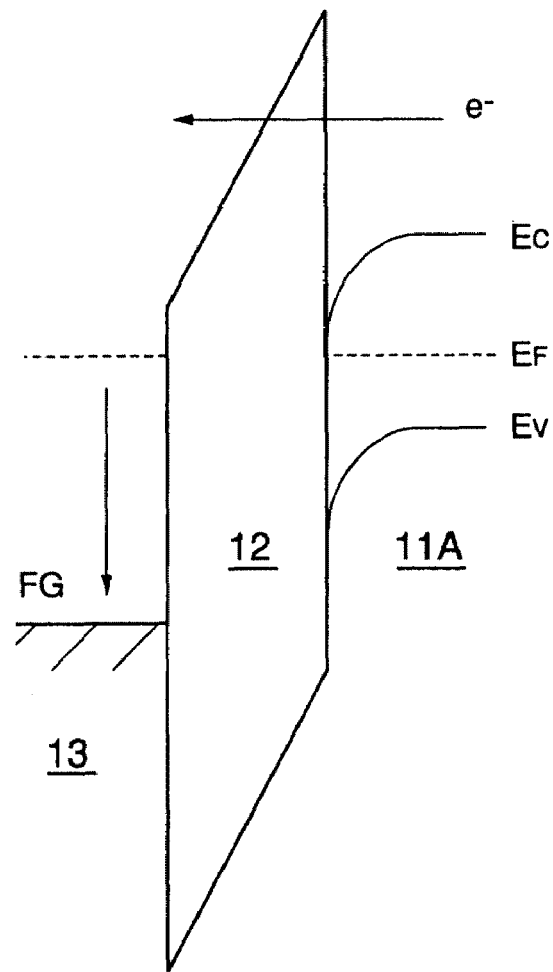

Further, in the step of FIG. 1C, the silicon nitride film 103C thus formed by the nitride film formation process in the step of FIG. 11C is used as a gate insulation film and the gate electrode 103D is formed on the gate insulation film 103C. Further, various patterning processes, ion implantation, passivation film formation, hydrogen sintering, and the like are conducted, and a semiconductor integrated circuit that includes therein transistors and capacitors is obtained.

While the present embodiment showed the case in which the nitride film is formed by a plasma processing apparatus that uses a radial line slot antenna, it is also possible to introduce the microwaves into the processing chamber by other ways. Further, while the present embodiment uses Ar for the plasma excitation gas, similar results are obtained also when Kr is used. Further, while the present embodiment uses $NH_3$ for the process gas, it is also possible to use a mixed gas of $N_2$ and $H_2$ for this purpose.

In the silicon nitride film formation process of the present invention, it is important that there remains hydrogen in the plasma even after the surface-terminating hydrogen is removed. As a result of the existence of hydrogen in the plasma, the dangling bonds inside the silicon nitride film as well as the dangling bonds on the interface are terminated by forming Si—H bonds or N—H bond, and as a result, electron traps are eliminated from the silicon nitride film and the interface.

The existence of the Si—H bond and the N—H bond is confirmed respectively by infrared absorption spectroscopy and by X-ray photoelectron spectroscopy. As a result of the existence of hydrogen, the hysteresis in the CV characteristics is eliminated and the interface state density at the silicon/silicon nitride film is suppressed to $2 \times 10^{10}$ cm$^{-2}$. In the case of forming the silicon nitride film by using a rare gas (Ar or Kr) and an $N_2$/$H_2$ mixed gas, it is possible to suppress the traps of electrons or holes in the film drastically by setting the partial pressure of the hydrogen gas to 0.5% or more.

Figure 12:
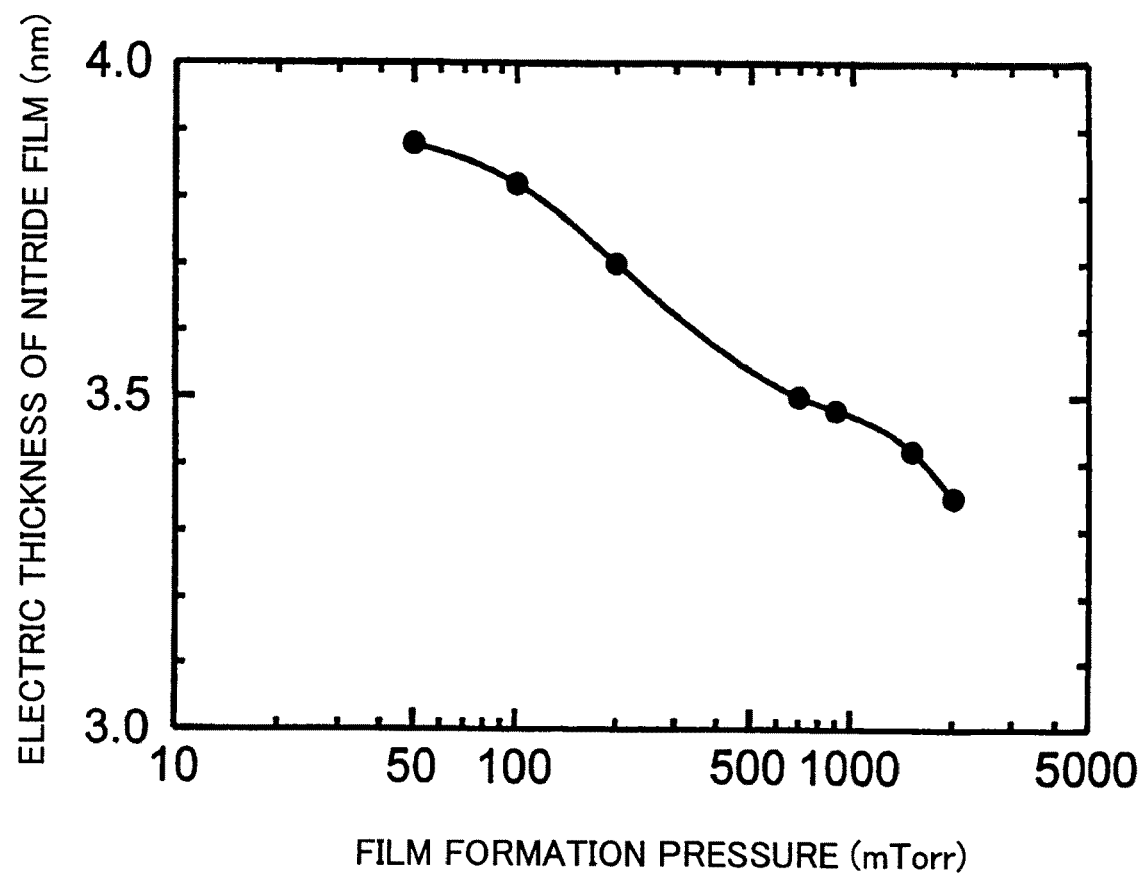
FIG. 12 is a characteristic diagram showing the dependence of the silicon nitride film thickness on the gas pressure of the processing chamber.

FIG. 12 shows the pressure dependence of the silicon nitride film thickness formed according to the process noted above. In the experiment of FIG. 12, it should be noted that the Ar/$NH_3$ partial pressure ratio was set to 98/2 and the deposition was conducted for 30 minutes.

Referring to FIG. 12, it can be seen that there occurs an increase of deposition rate of the nitride film by reducing the pressure in the processing chamber and thus by increasing the energy given to $NH_3$ (or $N_2$/$H_2$). Thus, from the viewpoint of efficiency of nitride film formation, it is preferable to set the gas pressure to the range of 6.65-13.3 Pa (50-100 mTorr). On the other hand, from the viewpoint of productivity, it is preferable to use a unified pressure suitable to the oxidation processing such as 133 Pa (1 Torr), particularly in the case of conducting oxidation and nitridation continuously, as will be explained with reference to other embodiments. Further, it is preferable to set the partial pressure of $NH_3$ (or $N_2$/$H_2$) in the rare gas to the range of 1-10%, more preferably to the range of 2-6%.

It should be noted that the silicon nitride film 103C thus obtained by the present embodiment showed a specific dielectric constant of 7.9, while this value is about twice as large as the specific dielectric constant of a silicon oxide film.

Measurement of the current versus voltage characteristics of the silicon nitride film 103C obtained by the present embodiment has revealed the fact that the film shows a leakage current characteristic smaller by order of 5-6 than that of a thermal oxide film having the thickness of 1.5 nm the film has a thickness of 3.0 nm (equivalent to the oxide film thickness of 1.5 nm), under the condition that a voltage of 1V is applied. This means that it is possible to break through the limitation of miniaturization that appears in the conventional transistors that use a silicon oxide film for the gate insulation film, by using the silicon nitride film of the present embodiment.

Further, it should be noted that the film formation condition of the nitride film noted above as well as the physical and electrical properties are not limited to the case of forming the silicon nitride film on the <100> oriented silicon surface but are valid also in the case of forming the silicon nitride film on silicon of any surface orientation including the <111> surface.

It should be noted that the preferable results achieved by the present embodiment are not only attained by the removal of the terminating hydrogen but also by the existence of Ar or Kr in the nitride film. Thus, in the nitride film of the present embodiment, it is believed that Ar or Kr relaxes the stress inside the nitride film or at the silicon/nitride film interface. As a result, the fixed electric charges in the nitride film or the interface state density is reduced, and this contributed also to the remarkable improvement of the electric properties and the reliability of the nitride film.

Particularly, it is thought that the existence of Ar or Kr with the surface density of 5×1011/cm2 or less is effective for the improvement of the electric properties and reliability of the silicon nitride film, just like the case of the silicon oxide film.

In order to realize the nitride film 103C of the present invention, it is also possible to use other plasma processing apparatus than the one shown in FIG. 5, as long as it enables low temperature oxide film formation by using plasma. For example, it is possible to use a two-stage shower plate type plasma processing apparatus that includes a first gas release structure for releasing an Ar or Kr gas for excitation of plasma by microwave and a second gas release structure different from the first gas release structure for releasing the $NH_3$ (or $N_2/H_2$) gas.

Third Embodiment

FIGS. 13A-13D show the formation method of a two-layer laminated dielectric structure according to a third embodiment of the present invention in which an oxide film and nitride film formed by the low-temperature plasma process are laminated, as well as a fabrication process of a semiconductor device that uses such a two-layer laminated dielectric structure.

It should be noted that the apparatus used for the formation of the oxide film and the nitride film in the present embodiment is identical with the apparatus of FIG. 5. In the present embodiment, Kr is used for the plasma excitation gas at the time of formation of the oxide film and the nitride film.

Figure 13A:
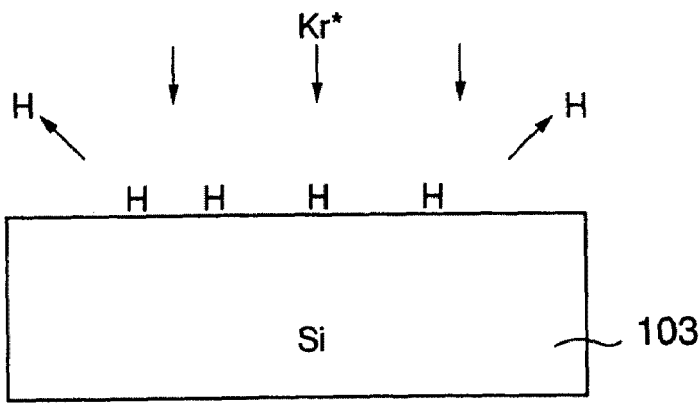
FIGS. 13A-13D are diagrams showing the formation method of an oxide/nitride laminated dielectric film and a fabrication method of a semiconductor device according to a third embodiment of the present invention.

First, in the step of FIG. 13A, the vacuum vessel (processing chamber) 101 is evacuated to the vacuum state and an Ar gas is introduced into the processing chamber 101 from the shower plate 102. Next, the gas to be introduced next is switched to the Kr gas from the initial Ar gas, and the pressure of the processing chamber 101 is set to about 133 Pa (1 Torr).

Next, the silicon substrate 103, preprocessed in the preprocessing step immediately before by conducting the diluted hydrofluoric acid treatment for terminating the surface dangling bonds of silicon by hydrogen, is introduced into the processing chamber 101 and placed on the stage 104 having a heating mechanism. Further, the temperature of the specimen is set to 400° C.

Next, a microwave of 2.45 GHz frequency is introduced to the radial line slot antenna 106 from the coaxial waveguide 105 for 1 minute, wherein the microwave thus supplied is introduced into the processing chamber 101 via the dielectric plate 107. Thereby, there is induced high-density Kr plasma in the processing chamber 101, and the surface-terminating hydrogen is removed by exposing the surface of the silicon substrate 103 to the plasma.

Figure 13B:
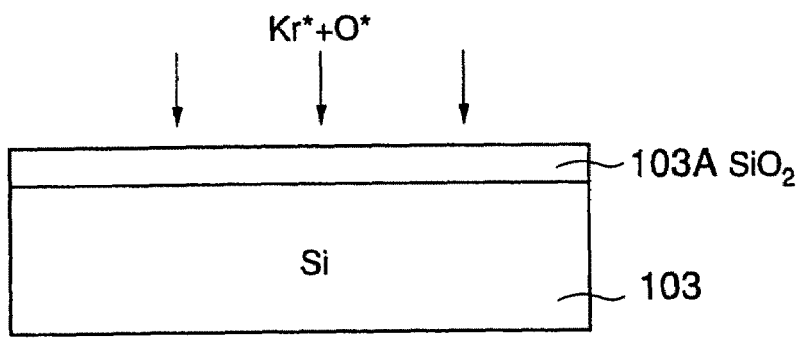

Next, in the step of FIG. 13B, the pressure inside the processing chamber 101 is maintained at 133 Pa (1 Torr) and a Kr/O2 mixed gas is introduced from the shower plate 102 with a partial pressure ratio of 97/3. Thereby, there is formed a silicon oxide film 103A on the surface of the silicon substrate 103 with a thickness of 1.5 nm.

Figure 13C:
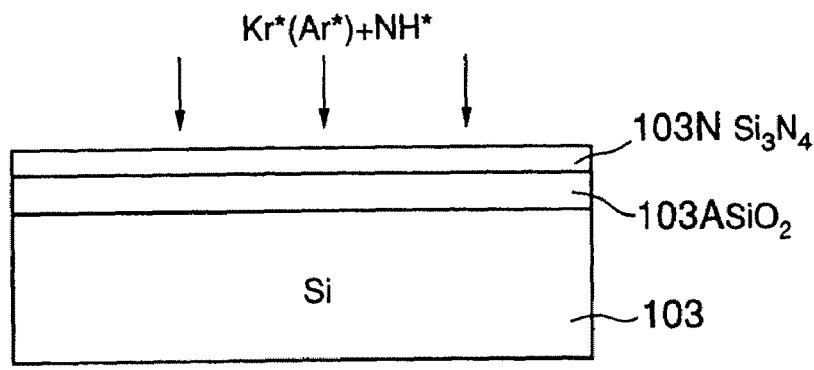

Next, in the step of FIG. 13C, the supply of microwaves is shutdown momentarily and supply of the $O_2$ gas is terminated. After purging the interior of the vacuum vessel (processing chamber) 101 with Kr, a mixed gas of $Kr/NH_3$ is introduced from the shower plate 103 with a partial pressure ratio of 98/2. Further, the pressure of the processing chamber is set to about 133 Pa (1 Torr) and the microwave of 2.56 GHz is introduced again to form the high-density plasma in the processing chamber 101. With this, a silicon nitride film 103N is formed on the surface of the silicon oxide film 103A with a thickness of 1 nm.

Upon formation of the silicon nitride film 103A with the desired thickness, the microwave power is shutdown and the plasma excitation is terminated. Further, the $Kr/NH_3$ mixed gas is replaced with Ar gas and the oxynitridation processing is terminated.

Figure 13D:
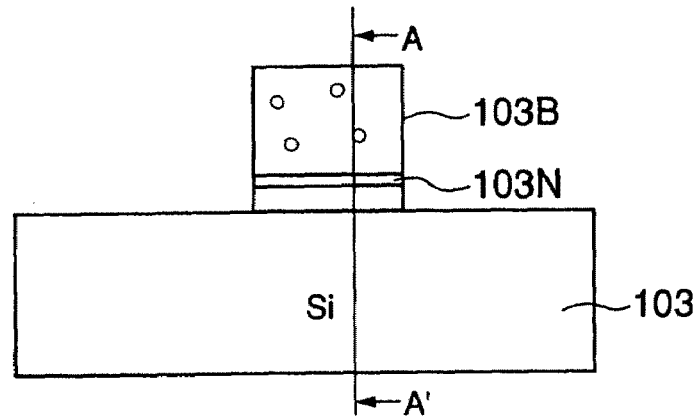

Next, in the step of FIG. 13D, the oxynitride film thus obtained is used for the gate insulation film and a gate electrode 103B is formed thereon. Further, by conducting various patterning processing, ion injection processing, passivation film formation processing, hydrogen sintering processing, and the like, a semiconductor integrated circuit having transistors or capacitors is obtained.

Measurement of the effective dielectric constant conducted on such a laminated gate insulation film ahs revealed the value of about 6. Further, the film showed excellent electric properties and reliability such as leakage current characteristic, breakdown characteristic, hot-carrier resistance, similarly to the case of the first embodiment. The gate insulation film thus obtained showed no dependence of surface orientation of the silicon substrate 103, and excellent gate insulation film was formed also on the silicon of any surface orientation other than the <100> surface.

While the present embodiment explained the two-layer construction in which an oxide film located closer to the silicon side and a nitride film are laminated, it is also possible to change the order of lamination of the oxide film and the nitride film depending on the propose. Further, it is also possible to form the structure of plural laminated films such as oxide/nitride oxide, nitride/oxide/nitride, and the like.

Figure 14:
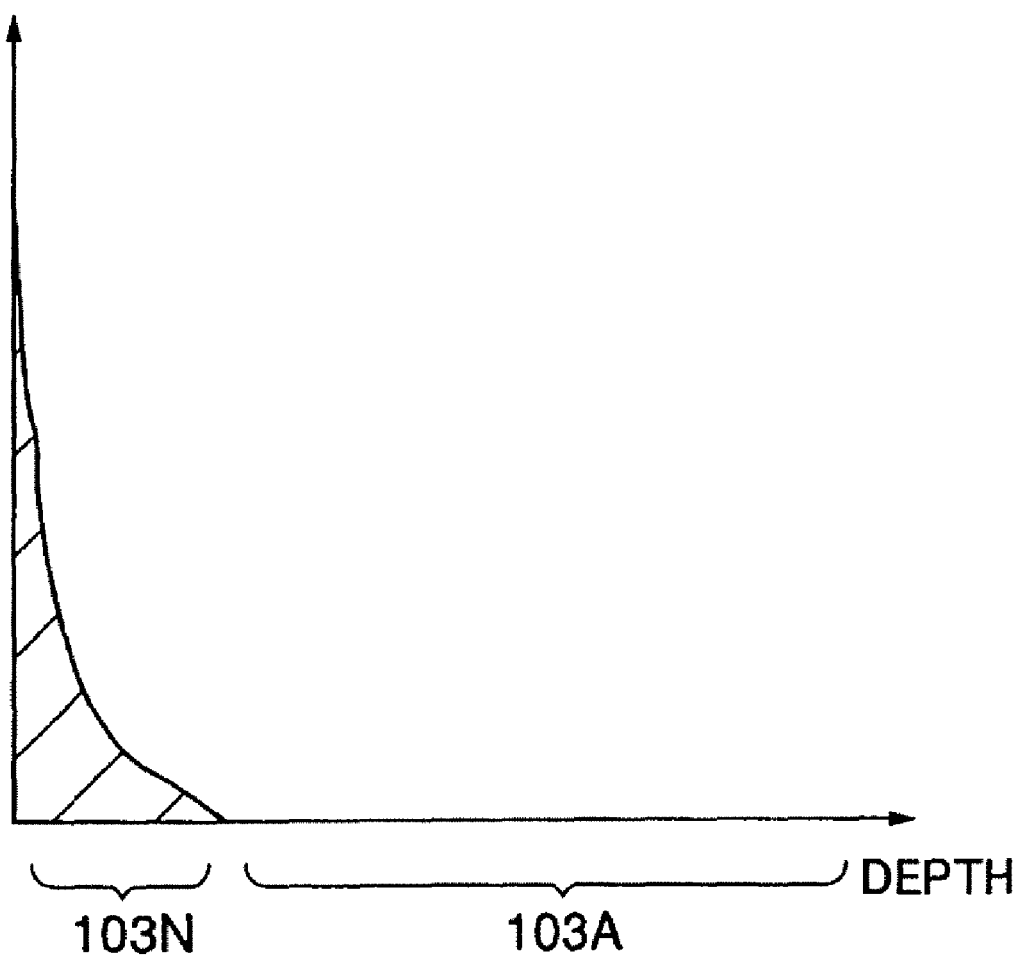
FIG. 14 is a diagram showing the nitrogen distribution in the oxide/nitride laminated dielectric film.

FIG. 14 shows the nitrogen concentration distribution in the two-layer laminated structure obtained by the present embodiment.

Referring to FIG. 14, it can be seen that there is caused concentration of nitrogen in correspondence to the nitride film 103N at the depth of 2-3 nm from the surface of the dielectric film, while there occurs no further penetration of nitrogen. Thus, according to the present embodiment, it is possible to form a nitride region at the oxide film surface with the thickness of 2-3 nm stably.

Figure 15:
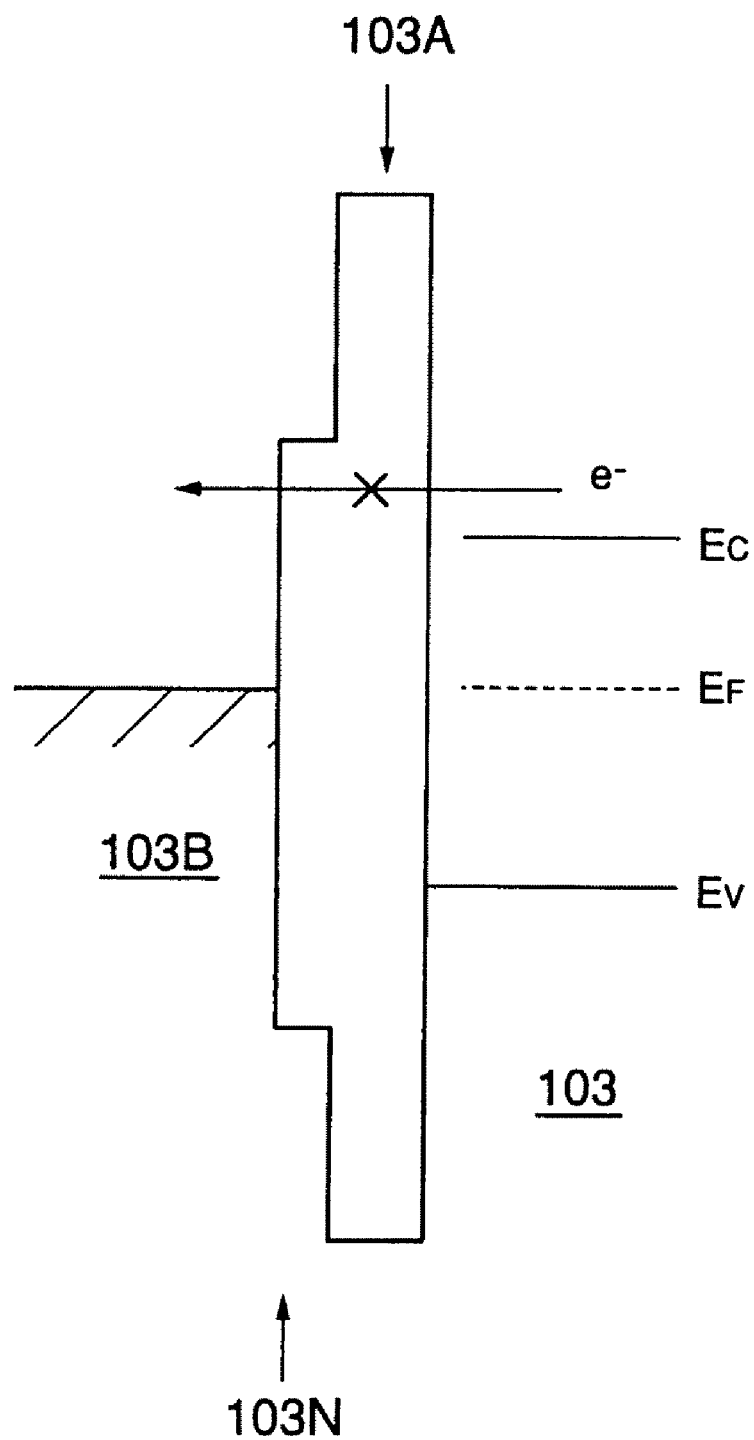
FIG. 15 is a band structure diagram of the oxide/nitride laminated dielectric film.

FIG. 15 shows the band structure of the semiconductor device of FIG. 13D taken along the cross-section A-A' for the thermal equilibrium state.

Referring to FIG. 15, there is formed a nitride layer 103N of small bandgap adjacent to the silicon oxide layer 103A of large bandgap, and the gate electrode 103B is formed adjacent to the nitride film layer 103N. Further, the silicon substrate 103 exists adjacent to the silicon oxide film layer 103A.

In such a band structure, it should be noted that the conduction electrons in the silicon substrate 103 are blocked by the thick dielectric film formed of the silicon oxide film 103A and the nitride film 103N as long as the semiconductor device is in the non-driving state in which no voltage is applied to the gate electrode 103A, and there is caused no leakage of the conduction electrons to the gate electrode 103A. As will be explained later with reference to the flash memory device, the band structure of FIG. 15 is extremely effective for suppressing the leakage current and simultaneously increasing the current density of the tunneling current.

Fourth Embodiment

Figure 16A:
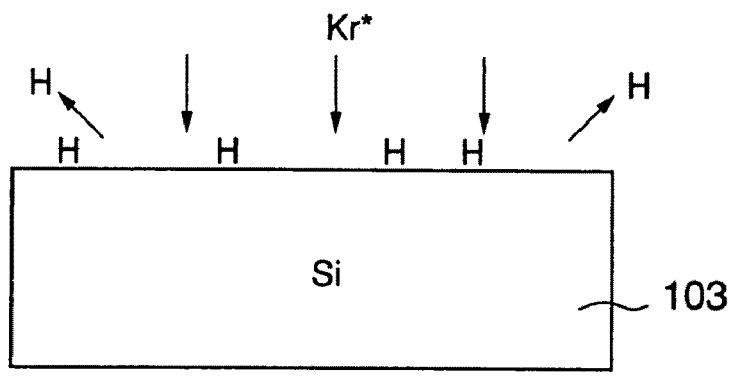
FIGS. 16A-16C are diagrams showing the formation method of an oxynitride film and a fabrication method of a semiconductor device according to a fourth embodiment of the present invention.
Figure 16B:
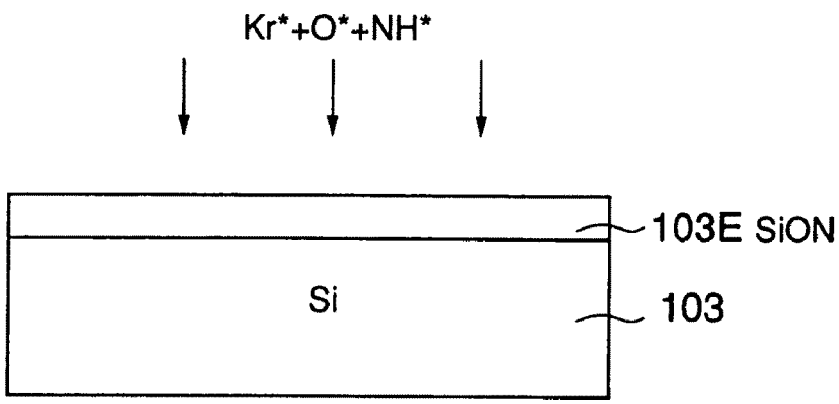
Figure 16C:
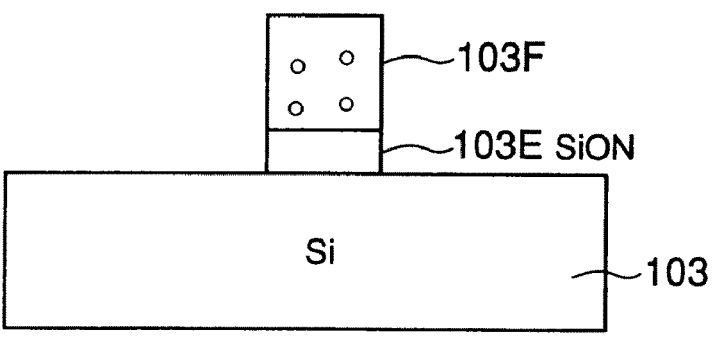

FIG. 16A-16C show the formation method of an oxynitride film conducted at low temperature by using plasma according to a fourth embodiment of the present invention and a fabrication process of a semiconductor device that uses such an oxynitride film. It should be noted that the oxynitride film formation apparatus used in the present embodiment is identical with the one shown in FIG. 5. In the present embodiment, Kr is used for the plasma excitation gas.

First, the interior of the vacuum vessel (processing camber 101) of FIG. 5 is evacuated to the vacuum state in the step of FIG. 16A, and an Ar gas is introduced into the processing chamber 101 from the shower plate 102. Next, the gas introduced to the processing chamber 101 is switched to a Kr gas from the Ar gas, and the pressure inside the processing chamber is set to about 133 Pa (1 Torr).

Further, the silicon substrate 103, preprocessed in the preprocessing step conducted immediately before by a diluted hydrofluoric treatment for terminating the dangling bonds of silicon on the surface by hydrogen, is introduced into the processing chamber 101 and is placed on the stage 104 having a heating mechanism. Further, the temperature of the specimen is set to 400° C.

Next, a microwave of 2.45 GHz frequency is supplied to the radial line slot antenna 106 from the coaxial waveguide 105 for 1 minute, wherein the microwave thus supplied is introduced into the processing chamber 107 from the radial lien slot antenna 106 through the dielectric plate 107. Thereby, there is formed high-density plasma of Kr in the processing chamber 101. The surface-terminating hydrogen is thus removed by exposing the surface of the silicon substrate 103 to the plasma thus excited on the Kr gas.

Next, in the step of FIG. 16B, the pressure of the processing chamber 101 is maintained at about 133 Pa (1 Torr) and a mixed gas of $Kr/O_2/NH_3$ is introduced from the shower plate 103 with the partial pressure ratio of 96.5/3/0.5. Thereby, a silicon oxynitride film 103E is formed on the silicon surface with the thickness of 3.5 nm. Upon formation of the silicon oxynitride film of the desire film thickness, the supply of the microwave power is shutdown and the plasma excitation is terminated. Further, the $Kr/O_2/NH_3$ mixed gas is replaced with the Ar gas and the oxynitridation processing is terminated.

Next, in the step of FIG. 16C, the oxynitride film 103E thus formed is used for the gate insulation film, and a gate electrode 103F is formed on the gate insulation film 103E. Further, by conducting various patterning processes, ion implantation processes, passivation film formation processes, hydrogen sintering processes, and the like, are conducted, and a semiconductor integrated circuit device having transistors and capacitors is obtained.

Figure 17:
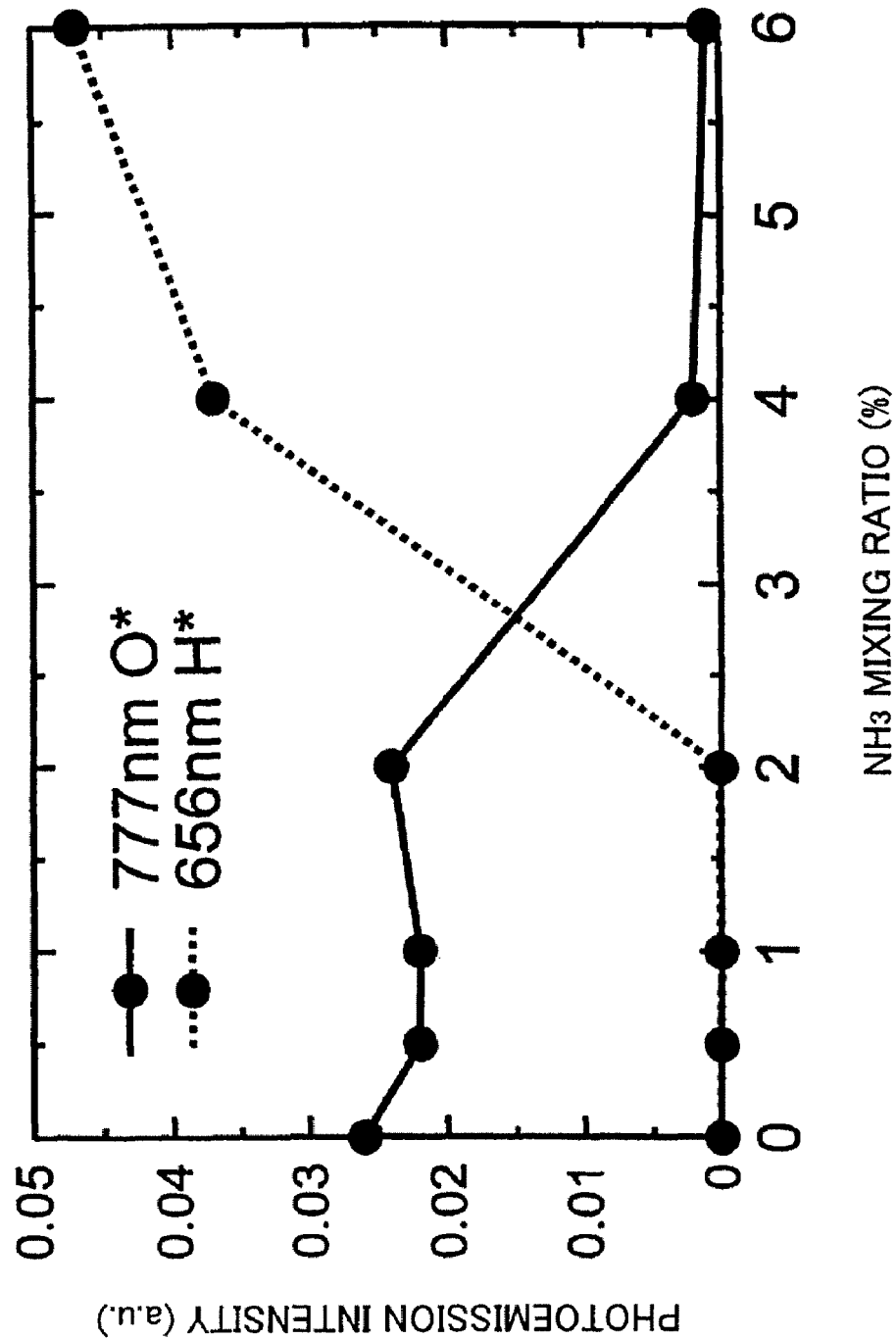
FIG. 17 is a diagram showing the photoemission intensity of atomic state oxygen and atomic state hydrogen at the time of formation of the oxynitride film.

FIG. 17 shows the relationship between the density of atomic state oxygen O* formed in the processing apparatus of FIG. 5 measured by photoemission analysis and the mixing ratio of the $NH_3$ gas in the $Kr/O_2/NH_3$ gas.

Referring to FIG. 17, the density of the atomic state oxygen O* as measured by the photoemission analysis does not change substantially when the mixing ratio of the $Kr/O_2/NH_3$ gas is in the range of 97/3/0-95/3/2, while when the ratio of $NH_3$ is increased further, the formation of the atomic state oxygen O* is reduced and the amount of the atomic state hydrogen is increased. Particularly, in the oxynitride film obtained in the case the mixing ratio of the $Kr/O2/NH_3$ gas is about 96.5/3/0.5, it can be seen that the leakage current becomes minimum and both of the breakdown voltage and the resistance against electric charge injection are improved.

Figure 18:
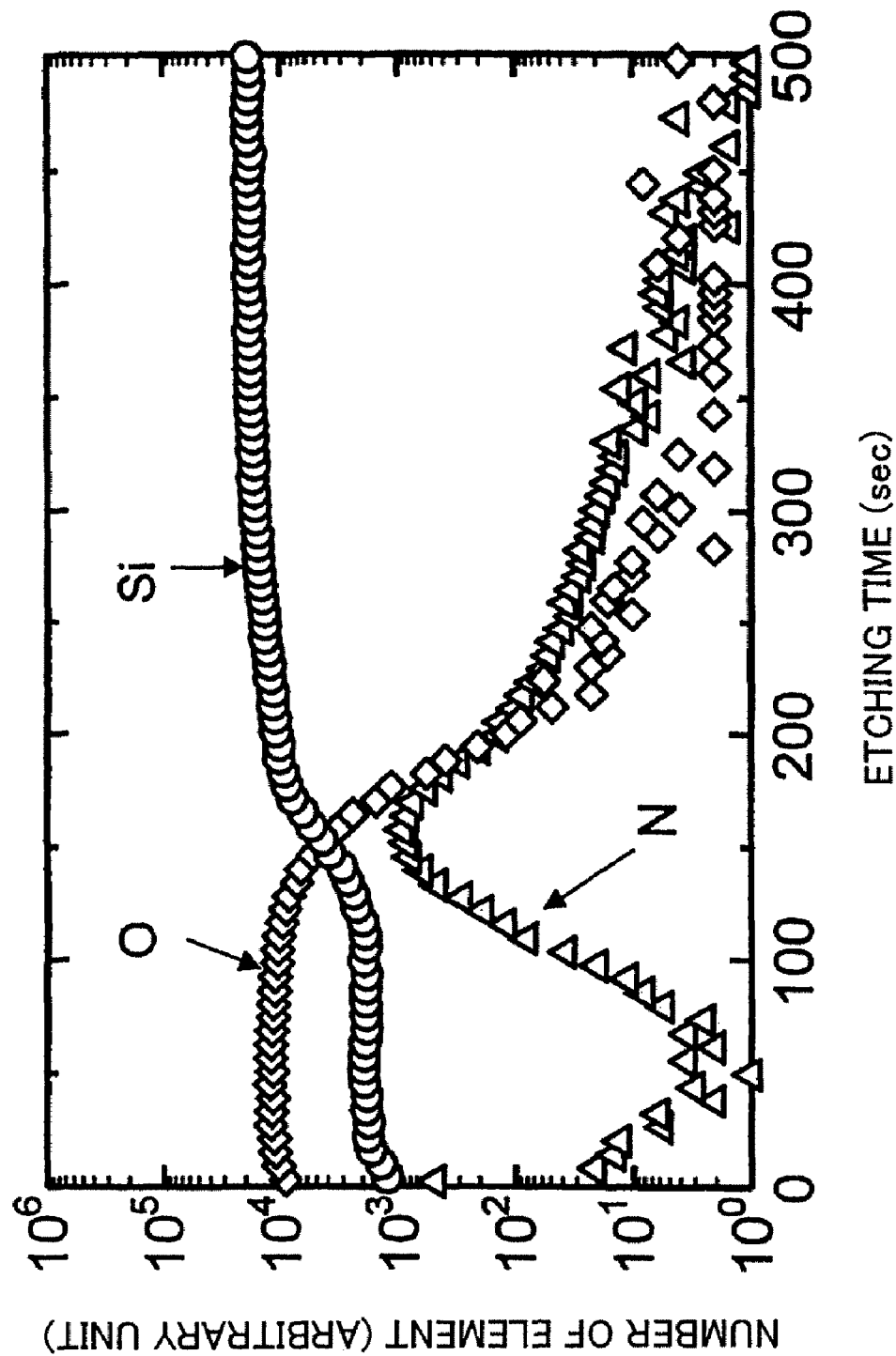
FIG. 18 is a diagram showing the elemental distribution profile in the silicon oxynitride film.

FIG. 18 shows the concentration distribution of silicon, oxygen and nitrogen in the oxynitride film of the present embodiment as measured by a secondary ion mass spectrometer, wherein the horizontal axis of FIG. 18 shows the depth as measured from the surface of the oxynitride film. In FIG. 18, it can be seen that the distribution of silicon, oxygen and nitrogen is changing gently in the film, while this merely means non-uniformity of etching and does not mean that the thickness of the oxynitride film is non-uniform.

Referring to FIG. 18, it can be seen that the concentration of nitrogen in the oxynitride film is large at the silicon/silicon oxynitride film interface and also at the silicon oxynitride film surface and decreases at the central part of the oxynitride film. Thereby, it should be noted that the amount of nitrogen incorporated into the oxynitride film is several ten percent as compared with silicon or oxygen. As will be explained later, the nitrogen concentrating to the silicon/silicon oxynitride film interface in the silicon oxynitride film of FIG. 18 is thought as relaxing the stress at such an interface. As a result of such stress relaxation, the trapping of electric charges in the film or the density of interface states caused by the stress is reduced in the silicon oxynitride film of FIG. 18, and this contributes to the reduction of the leakage current.

Figure 19:
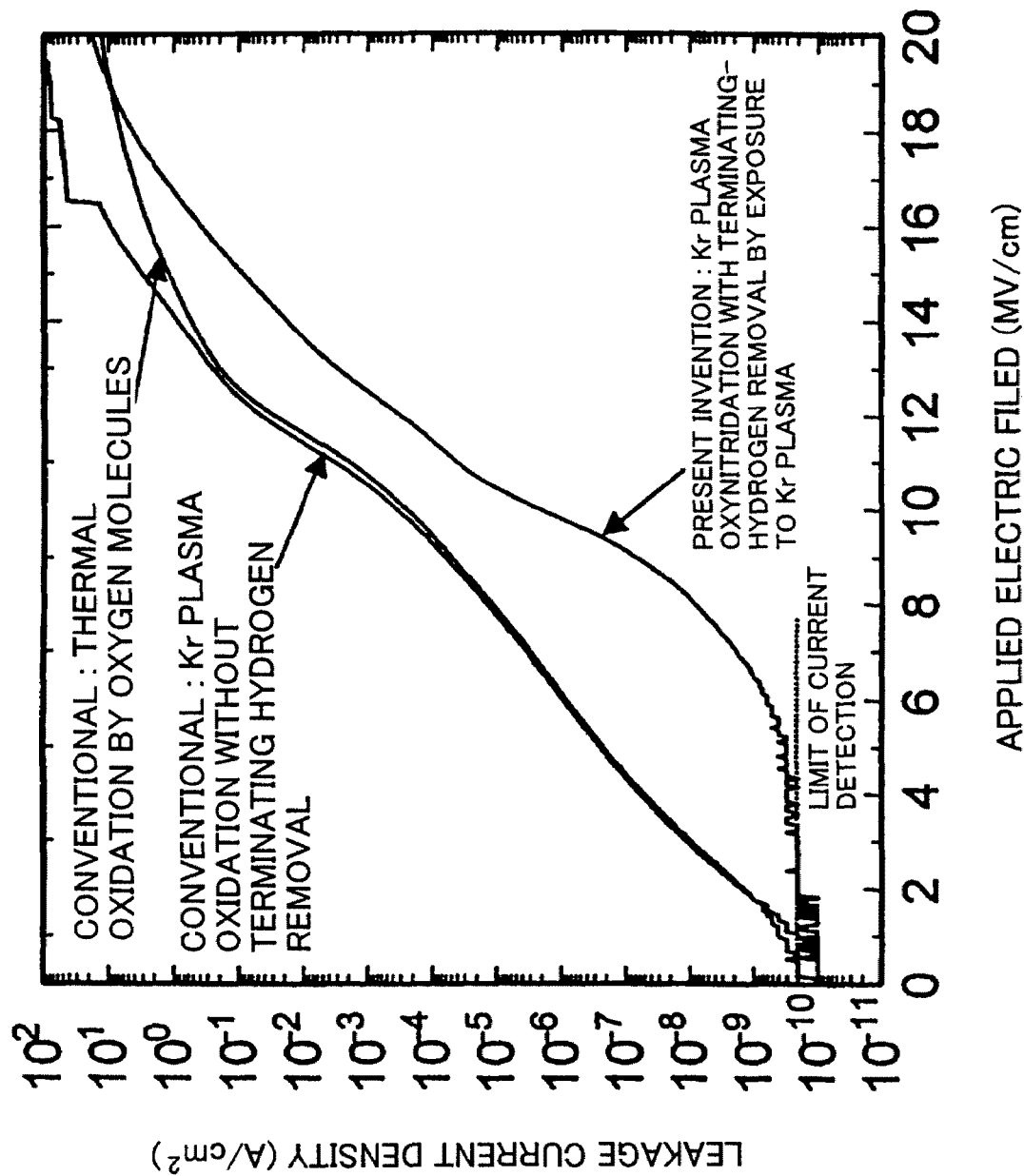
FIG. 19 is a characteristic diagram showing the current versus voltage characteristic of the silicon oxynitride film.

FIG. 19 shows the dependence of leakage current of the oxynitride film of the present embodiment on the applied electric field, wherein FIG. 19 also shows the leakage current characteristic of the oxide film of the same film thickness in which the exposure process to the Kr plasma is omitted before the oxide film formation process by the microwave plasma and further the leakage current characteristic of the oxide film formed by a thermal oxidation process for the purpose of comparison.

Referring to FIG. 19, it can be seen that the value of the leakage current at the same electric field is reduced by the order of 2-4 in the oxynitride film of the present embodiment in which the oxynitridation processing is conducted by introducing the $Kr/O_2/NH_3$ gas after removing the terminating hydrogen by the Kr plasma irradiation as compared with the oxide film formed by the conventional process and that the oxynitride film thus formed has excellent low-leakage characteristics.

In FIG. 10 explained before, it should be noted that the relationship of the leakage current characteristic and the film thickness of the oxynitride film thus formed is represented by ■.

Referring to FIG. 10 again, the oxynitride film formed by the present embodiment after conducting the Kr irradiation has a similar leakage characteristic to the oxide film formed with a similar process and that the leakage current is only $1\times10^{-2}$ A/cm$^2$ also in the case the film thickness is about 1.6 nm.

It should be noted that the oxynitride film of the present embodiment also showed excellent electric properties and reliability such as breakdown characteristic and hot carrier resistance superior to the oxide film of the first embodiment explained before. Further, there was observed no dependence on the surface orientation of the silicon substrate, and thus, it becomes possible to form a gate insulation film of excellent characteristics not only on the <100> surface of silicon but also on the silicon surface of any surface orientation.

As explained above, it becomes possible to form a silicon oxynitride film of superior characteristics and film quality on the silicon surface of any surface orientation at the low temperature of 400° C. by conducting the silicon oxynitridation processing by using the $Kr/O_2/NH_3$ high-density plasma, after removing the surface-terminating hydrogen.

The reason why such advantageous effect can be achieved by the present embodiment is attributed not only to the reduction of hydrogen content in the oxynitride film caused by removal of the surface-terminating hydrogen but also to the effect of the nitrogen contained in the oxynitride film with a proportion of several ten percent or less. In the oxynitride film of the present embodiment, the content of Kr is about 1/10 or less as compared with the oxide film of the first embodiment, and in place of Kr, the film contains a large amount of nitrogen. Thus, in the present embodiment, it is believed that the reduction of hydrogen in the oxynitride film causes reduction of weak bonds in the silicon oxynitride film, while the existence of nitrogen in the film caused relaxation of stress in the film or at the Si/SiO$_2$ interface. As a result of this, the number of trapped electrical charges in the film or the surface state density is reduced, and the electric properties of the oxynitride film is improved significantly. Particularly, it is believed the reduction of hydrogen concentration level in the oxynitride film to $10^{22}$ cm$^{-2}$ or less, more preferably $10^{11}$ cm$^{-2}$ or less and the existence of nitrogen in the film with a proportion of several ten percent with respect to silicon or oxygen contribute to the improvement of the electric properties and reliability of the silicon oxynitride film.

In the present embodiment, the supply of the microwave power is shut down at the end of the oxynitridation processing upon formation of the silicon oxynitride film with the predetermined thickness, and the Kr/O$_2$/NH$_3$ mixed gas is replaced with the Ar gas. On the other hand, it is possible to terminate the oxynitridation processing by introducing a Kr/NH3 mixed gas with a partial pressure ratio of 98/2 from the shower plate 103 before the shutdown of the microwave power while maintaining the pressure at 133 Pa (1 Torr) and form a silicon nitride film on the surface of the silicon oxynitride film with a thickness of about 0.7 nm. According to this process, a silicon nitride film is formed on the surface of the silicon oxynitride film and an insulation film having a higher dielectric constant is obtained.

In the oxynitride film of the present embodiment, it should be noted that the concentration of nitrogen to the silicon/oxynitride film interface and the concentration of nitrogen to the surface of the oxynitride film explained with reference to FIG. 18 are maintained during the growth of the oxynitride film.

Figure 20:
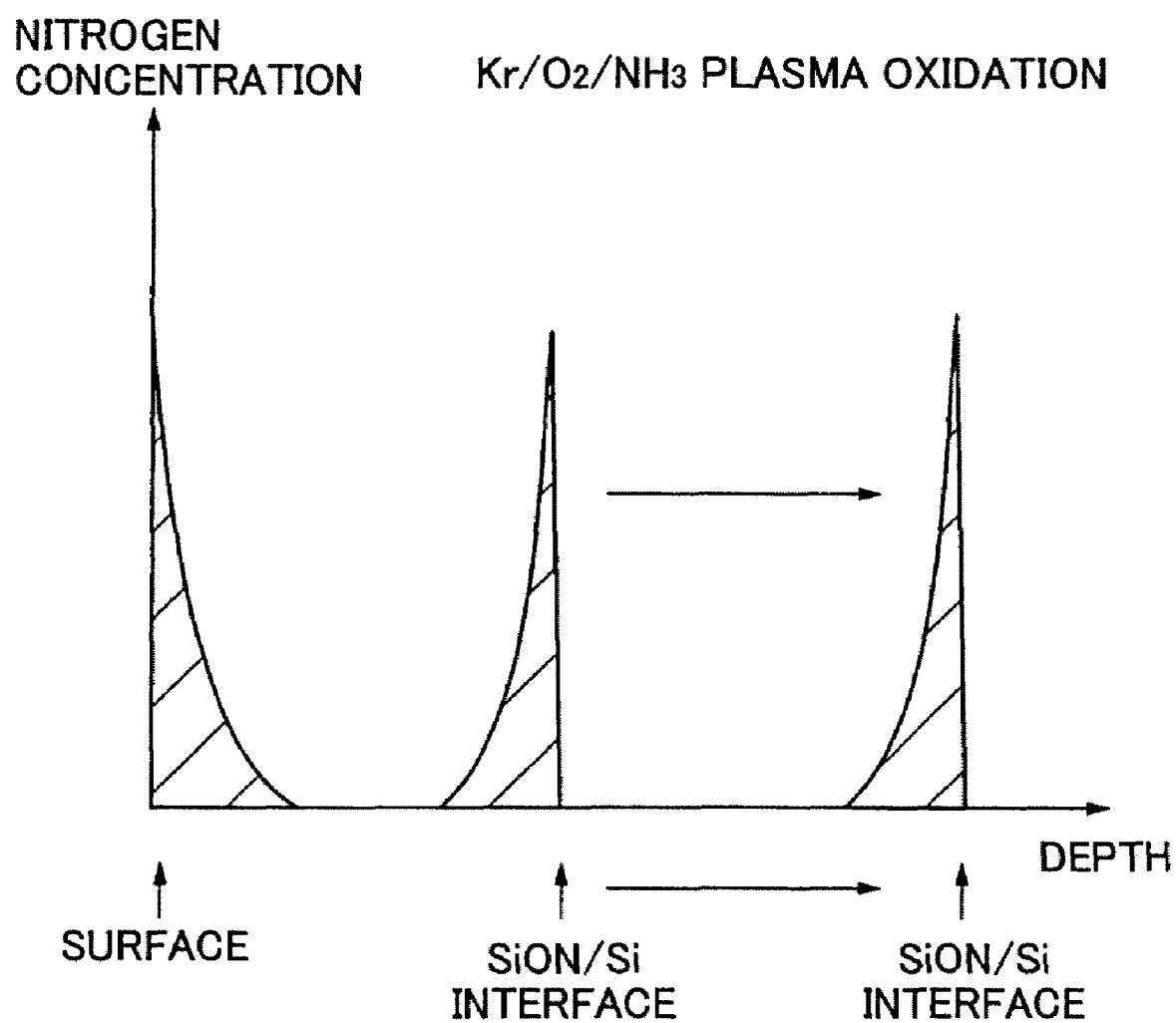
FIG. 20 is a schematic diagram showing the time-dependent change of nitrogen in the silicon nitride film.

FIG. 20 shows the change of the nitride distribution profile with the growth of the oxynitride film schematically.

Referring to FIG. 20, nitrogen concentrates to the surface of the oxynitride film and to the interface between the oxynitride film and the underlying silicon substrate, and this tendency is maintained even when the oxynitride film has grown. As a result, the oxynitride film, while having an overall composition of an oxynitride film, does have a composition near an oxide film in the mid depth part of the film and a composition near a nitride film at the surface as well at the interface between the oxynitride film and the substrate. Further, the depth of penetration of nitrogen at the oxynitride film is limited to 2-3 nm or less, and thus, the thickness of the nitride film formed on the surface of the oxynitride film is limited to 2-3 nm.

Fifth Embodiment

Next, formation of a semiconductor device according to a fifth embodiment of the present invention will be described wherein the semiconductor device includes a high-quality silicon oxide film formed on a corner part of the device isolation sidewall that constitutes a shallow-trench isolation or on a silicon surface having an undulating surface form.

Figure 21:
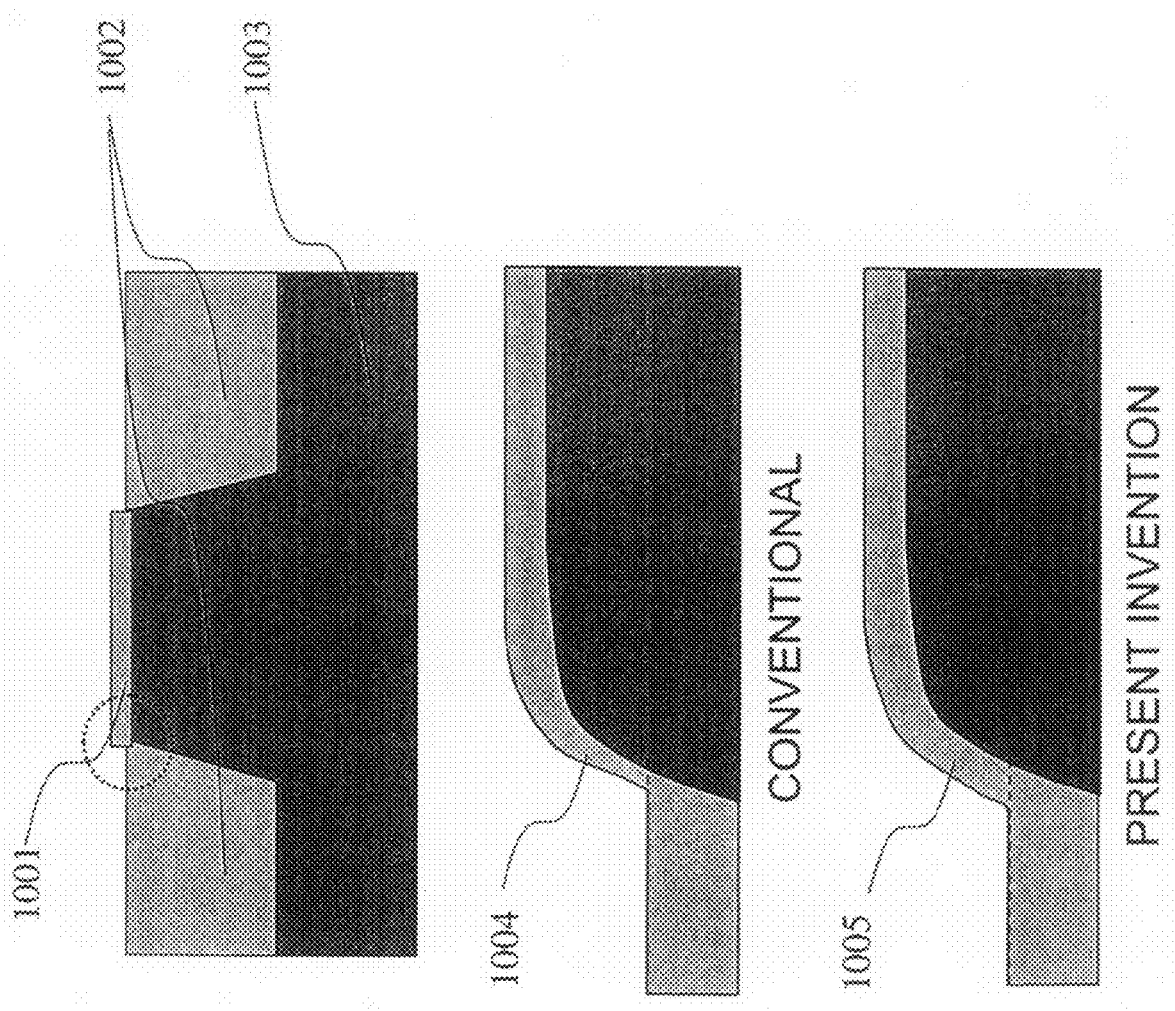
FIGS. 21A-21C are schematic diagrams showing the shallow trench isolation according to a fifth embodiment of the present invention.

FIG. 21A shows the concept of shallow trench isolation.

Referring to FIG. 21A, the illustrated shallow trench isolation is formed by forming an isolation trench on a surface of a silicon substrate 1003 by conducting a plasma etching process, filling the trench thus formed with a silicon oxide film 1002 formed by CVD, and planarizing the silicon oxide film 1002 by CMP, and the like.

In the present embodiment, the silicon substrate is exposed to an oxidizing atmosphere at 800-900° C. after the polishing step of the silicon oxide film 1002 to conduct sacrifice oxidation, and the silicon oxide film thus formed as a result of the sacrifice oxidation is etched away in a chemical solution containing hydrofluoric acid. Thereby, a silicon surface terminated with hydrogen is obtained. In the present embodiment, a procedure similar to the one explained in the first embodiment is conducted and the surface-terminating hydrogen is removed by using the Kr plasma. Thereafter, the Kr/O2 gas is introduced and the silicon oxide film is formed with the thickness of about 2.5 nm.

According to the present embodiment, the silicon oxide film is formed with a uniform thickness even on the corner part of the shallow trench isolation without causing a decrease of the silicon oxide film thickness. The silicon oxide film thus formed by plasma oxidation while using the Kr plasma has excellent QBD (charge-to-breakdown) characteristics including the shallow trench isolation part, and no increase of leakage current is caused even when the injected electric charges are $10^2$ C/cm$^2$. Thus, the reliability of the device is improved significantly.

In the case of forming the silicon oxide film by the conventional thermal oxidation process, the thickness of the silicon oxide film is severely reduced at the corner part of the shallow trench isolation with increasing taper angle of the shallow trench isolation, while in the present invention, no such thinning of the silicon oxide film is caused at such a corner part of the shallow trench isolation even when the taper angle is increased. Thus, in the present embodiment, the use of a near rectangular taper angle for the trench of the shallow trench isolation structure enables reduction of the area of the device isolation region, and a further increase of integration density becomes possible in the semiconductor device. It should be noted that the taper angle of about 70 degrees has been used for the device isolation part in the conventional technology, which relies on the thermal oxidation process, because of the limitation caused by the thinning of the thermal oxide film at the trench corner part as shown in FIG. 21B. According to the present invention, it becomes possible to use an angle of 90 degrees.

Figure 22:
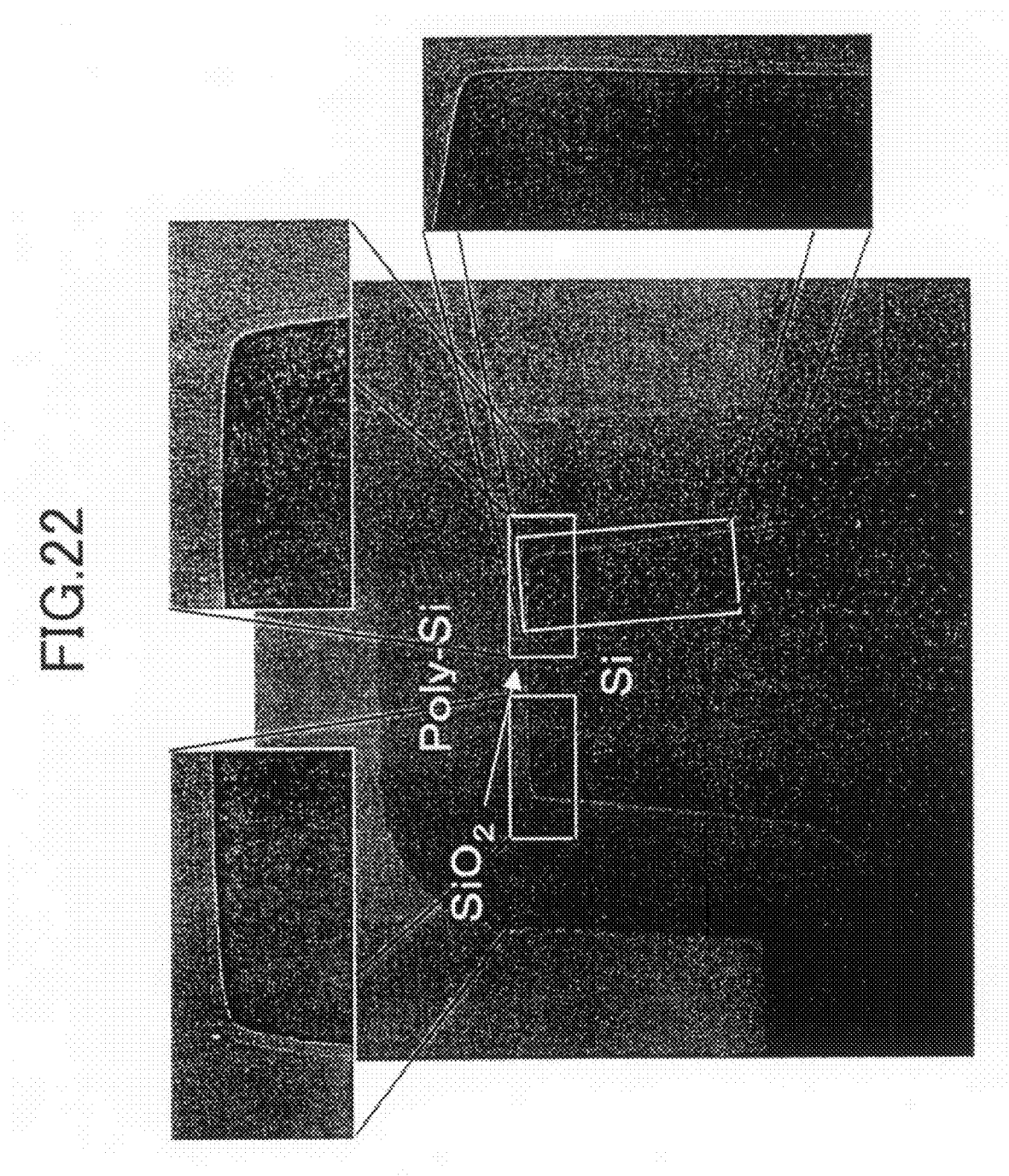
FIG. 22 is a cross-sectional diagram of a three-dimensional transistor formed on a silicon surface having projections and depressions according to the fifth embodiment of the present invention.

FIG. 22 shows the cross-sectional view of the silicon oxide film formed on a silicon surface in which an undulating surface morphology is formed by conducting a 90-degree etching, with a thickness of 3 nm according to the procedure of the first embodiment.

Referring to FIG. 22, it can be seen that a silicon oxide film of uniform thickness is formed on any of the surfaces.

The oxide film formed as such has excellent electric properties such as an excellent leakage current or breakdown characteristic, and thus, the present invention can realize a high-density semiconductor integrated circuit having a silicon three-dimensional structure, which may include plural surface orientations as in the case of a vertical structure.

Sixth Embodiment

Figure 23:
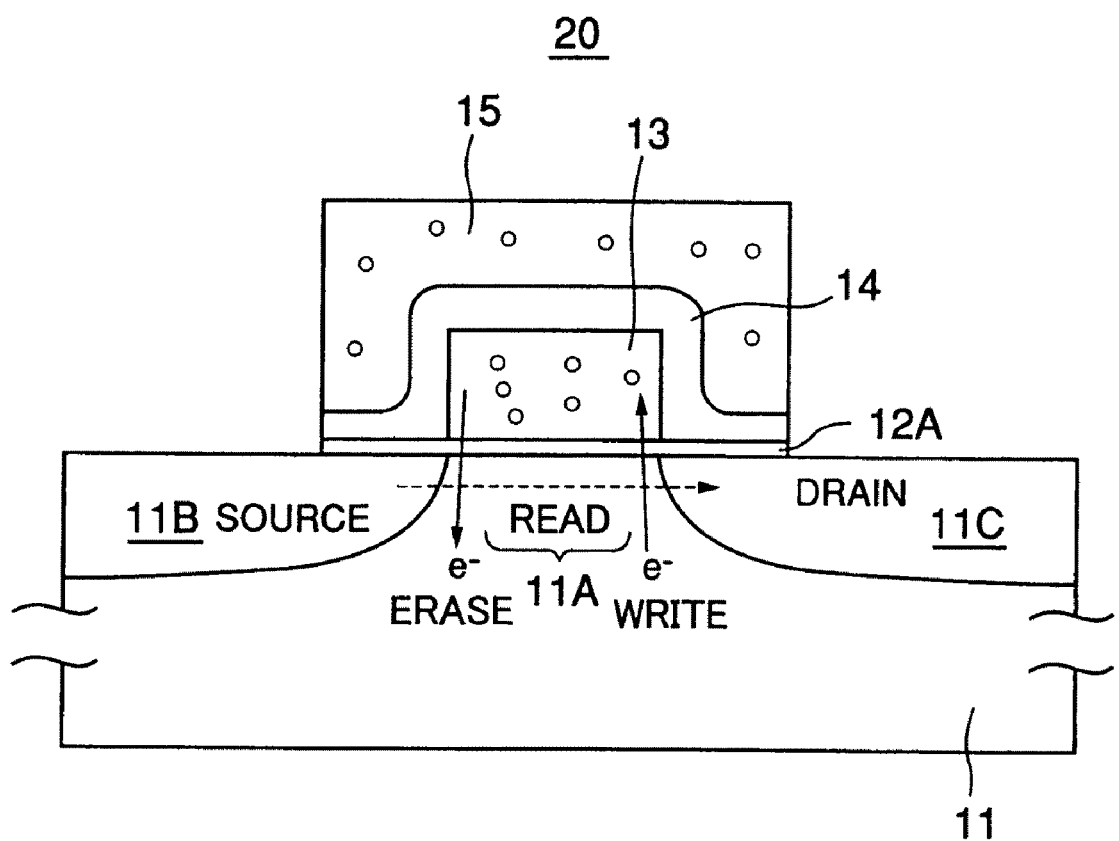
FIG. 23 is a diagram showing the construction of a flash memory device according to a sixth embodiment of the present invention.

FIG. 23 shows the construction of a flash memory device 20 according to a sixth embodiment of the present invention, wherein those parts corresponding to the parts described before are designated by the same reference numerals and the description thereof will be omitted.

Referring to FIG. 23, the flash memory device 20 of the present embodiment uses the dielectric film 12A of the third embodiment or the fourth embodiment, for the tunneling insulation film 12.

Figure 24:
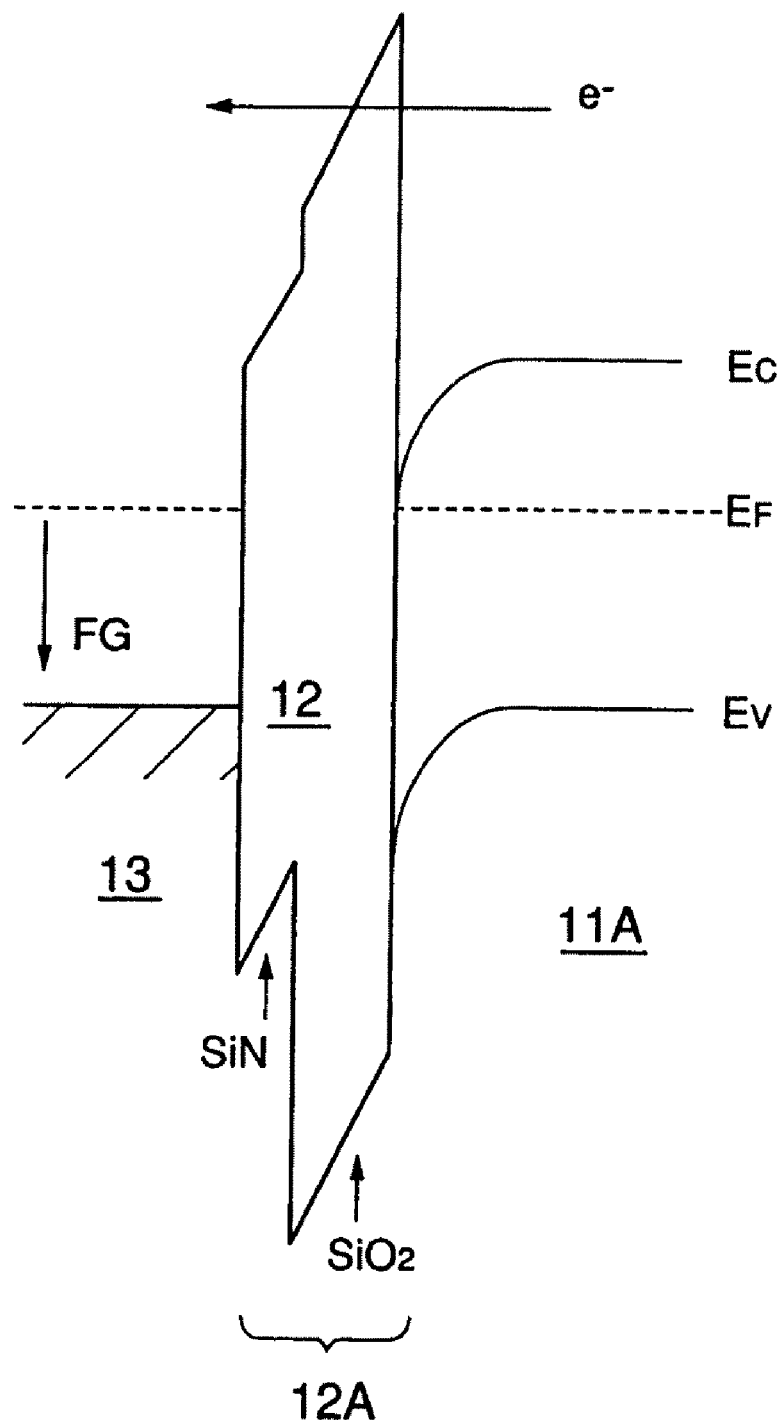
FIG. 24 is a band structure diagram showing the writing operation of the flash memory device of FIG. 23.

FIG. 24 shows the condition in which a write voltage is applied to the control gate electrode 15 in the flash memory device 20 of FIG. 23.

Referring to FIG. 24, it can be seen that the band structure of the silicon oxide film and the nitride film constituting the dielectric film 12A changes significantly upon application of the write voltage to the control gate electrode 15 due to the corresponding change of potential of the floating gate electrode 13, and the hot electrons formed in the channel region 11A are injected into the floating gate electrode 13 after passing through the triangular potential formed by the conduction band Ec of the silicon oxide film in the form of Fowler-Nordheim current.

As explained already with reference to FIG. 15, such a dielectric film forms a thick potential barrier with regard to the conducting electrons in the channel region 11A in the non-writing state of the flash memory device 20, and the tunneling current is effectively blocked.

Figure 3:
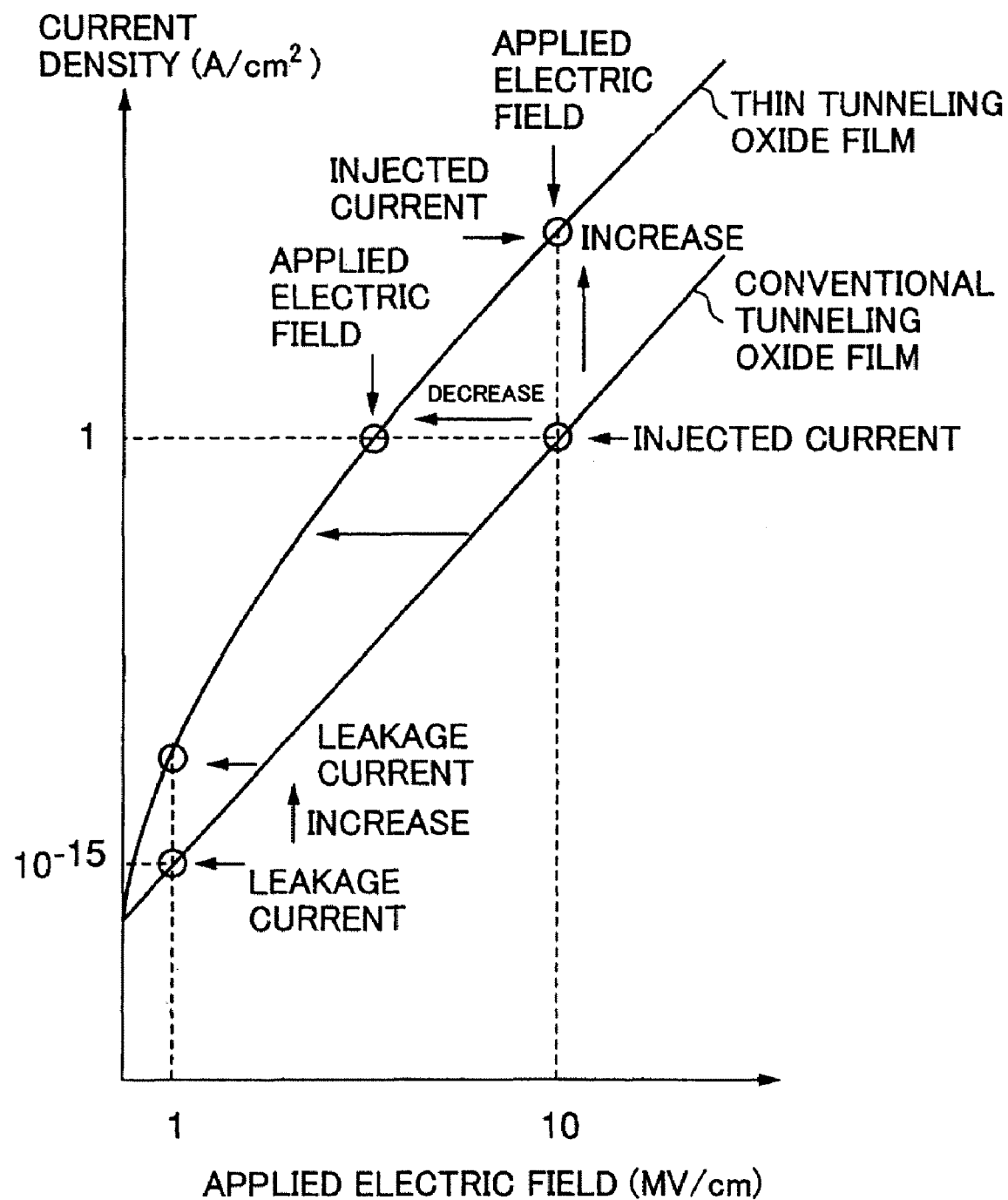
FIG. 3 is a diagram explaining the problems of the conventional flash memory device.
Figure 25:
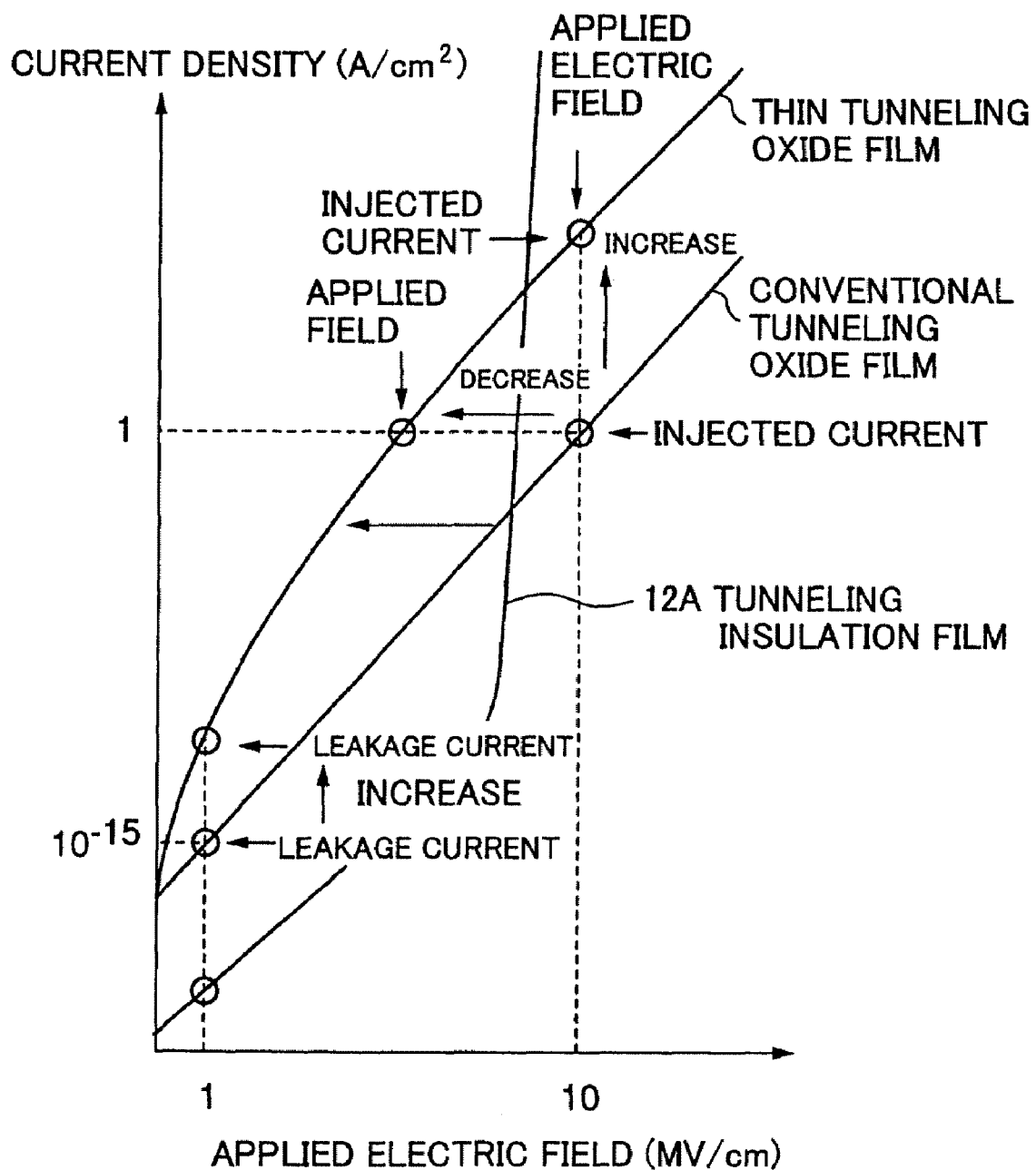
FIG. 25 is a diagram showing the leakage current characteristics of the tunneling insulation film in the flash memory device of FIG. 23.

FIG. 25 shows the voltage versus current characteristic of the tunneling insulation film 12A of the flash memory device 20 of FIG. 25 in superposition with the graph of FIG. 3.

Referring to FIG. 25, it can be seen that the tunneling insulation film 12A provides a very low leakage current when the applied electric field is small while the tunneling current increases sharply when the applied electric field is increased in response to application of a predetermined write voltage, and it becomes possible to conduct efficient writing of information in short time. Further, when conducting the writing with the level of conventional injection current, the time needed for writing is reduced.

In the flash memory device 20 of FIG. 23, the stress at the interface between the Si substrate 11 and the tunneling insulation film 12A is relaxed by using the oxynitride film 103E formed in the process of FIGS. 16A-16C for the tunneling insulation film 12A and the quality of the tunneling insulation film 12A is improved. As a result, the leakage current is reduced further. This means that the thickness of the tunneling insulation film 12A can be reduced, and thus, it becomes possible to realize a flash memory operating at low voltage.

Seventh Embodiment

Next, a flash memory device according to a seventh embodiment of the present invention that uses the low-temperature formation technology of oxide film and nitride film or the low-temperature formation technology of oxynitride film by plasma will be explained. In the description below, it should be noted that the explanation is made on a flash memory device, while it should be noted that the present invention is applicable also to EPROMs and EEPROMs.

Figure 26:
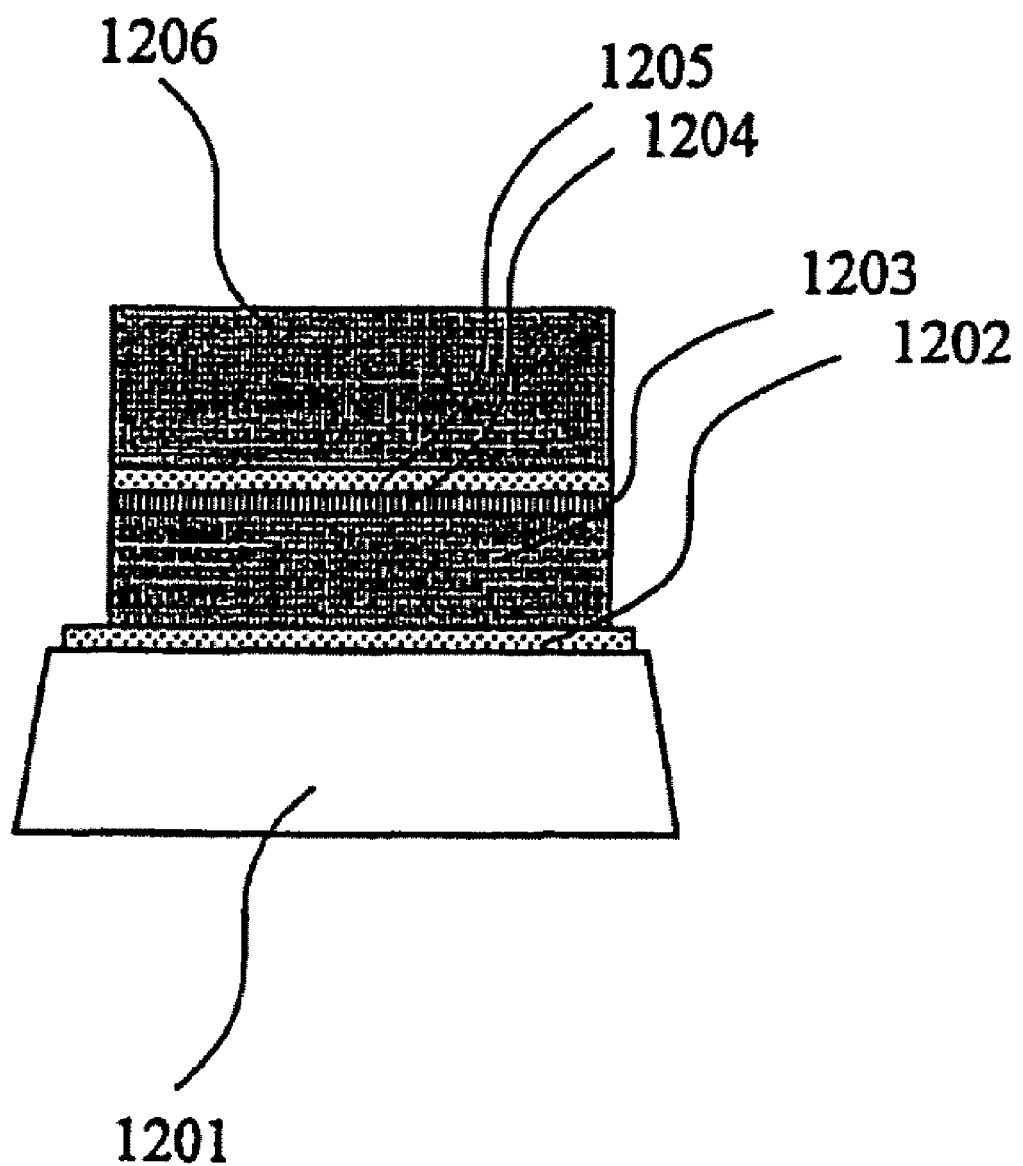
FIG. 26 is a schematic diagram showing the cross-sectional structure of a flash memory device according to a seventh embodiment of the present invention.

FIG. 26 shows the schematic cross-sectional diagram of a flash memory device according to the present embodiment.

Referring to FIG. 26, the flash memory device is constructed on a silicon substrate 1201 and includes a tunneling oxide film 1202 formed on the silicon substrate 1201, a first polysilicon gate electrode 1203 formed on the tunneling oxide film 1202 as a floating gate electrode, a silicon oxide film 1204 and a silicon nitride film 1205 formed consecutively on the polysilicon gate electrode 1203, and a second polysilicon gate electrode 1206 formed on the silicon nitride film 1205 as a control gate electrode. In FIG. 26, illustration of the source region, drain region, contact hole, interconnection patterns, and the like, is omitted. It should be noted that the silicon oxide film 1202 is formed by the silicon oxide film formation method explained with reference to the first embodiment, while the laminated structure of the silicon oxide film 1204 and the nitride film 1205 is formed by the formation method of silicon nitride film explained in relation to the third embodiment.

FIGS. 27-30 are schematic diagrams explaining the fabrication process of the flash memory device of the present embodiment step by step.

Figure 27:
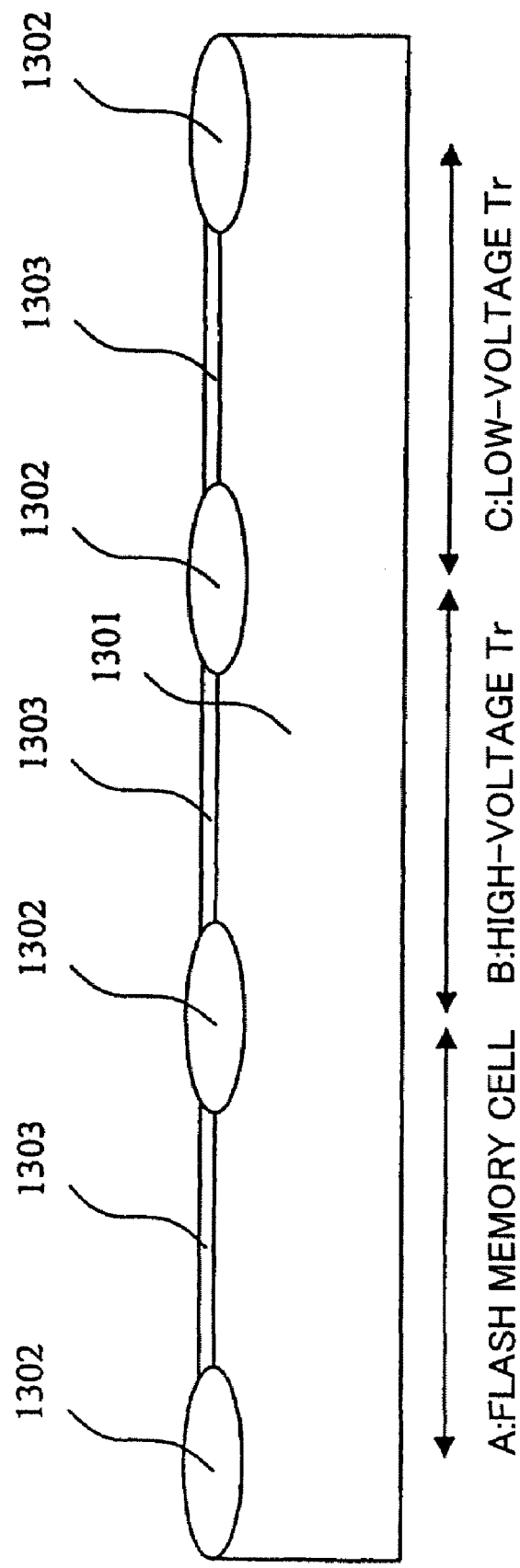
FIGS. 27-30 are schematic cross-sectional diagrams showing the fabrication process of the flash memory device of FIG. 26 step by step.

Referring to FIG. 27, a silicon substrate 1301 includes a flash memory cell region A, a high-voltage transistor region B and a low-voltage transistor region C such that the regions A-C are defined by a field oxide film 1302, wherein a silicon oxide film 1303 is formed on the surface of the silicon substrate 1301 in each of the regions A-C. The field oxide film 1302 may be formed by a selective oxidation process (LOCOS method) or shallow trench isolation method.

In the present embodiment, Kr is used for the plasma excitation gas for the removal of the surface-terminating hydrogen or for the formation of the oxide film and the nitride film. The same apparatus explained with reference to FIG. 5 is used for the formation of the oxide film and the nitride film.

Figure 28:
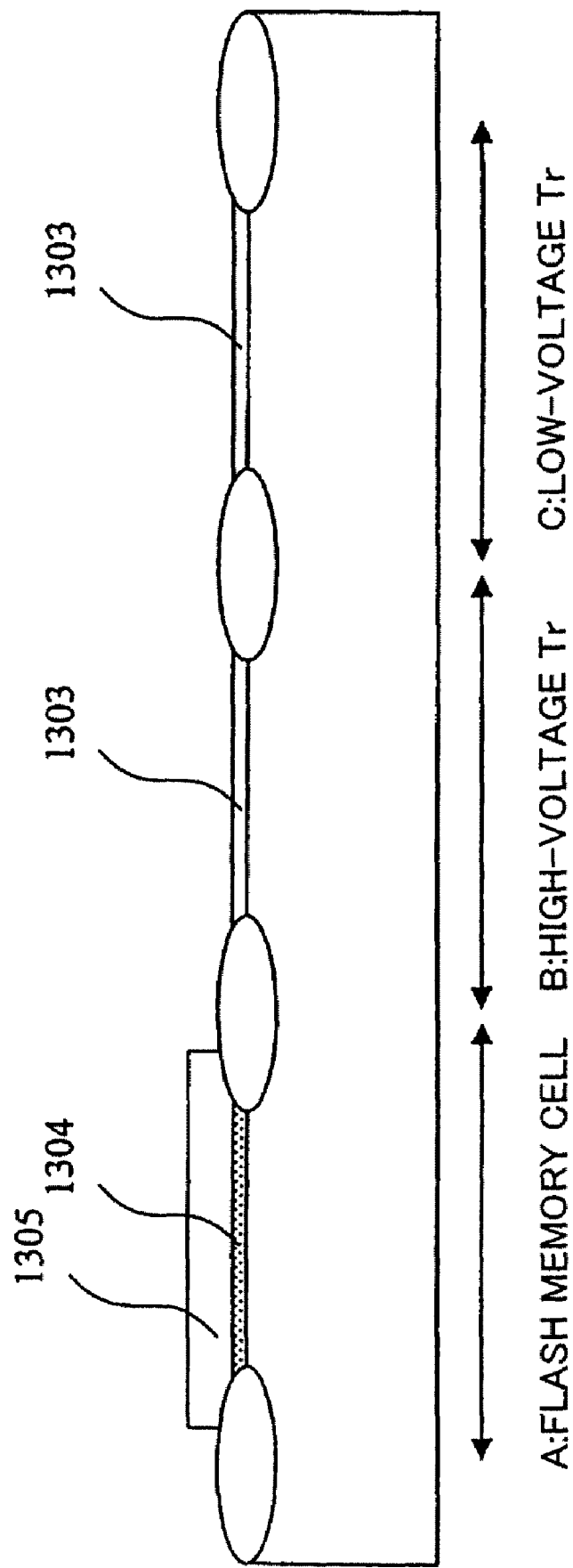

Next, in the step of FIG. 28, the silicon oxide film 1303 is removed from the memory cell region A and the silicon surface is terminated by hydrogen by conducting the cleaning process in a hydrochloric acid solution. Further, a tunneling oxide film 1304 is formed similarly the first embodiment before.

Thus, the vacuum vessel (processing chamber) 101 is evacuated to the vacuum state similarly to the first embodiment and the Ar gas is introduced into the processing chamber 101 from the shower plate 102. Next, the Ar gas is switched to the Kr gas and the pressure inside the processing chamber 101 is set to about 1 Torr.

Next, the silicon oxide film 1303 is removed and the hydrofluoric acid treatment is applied to the silicon substrate. The silicon substrate 1301 thus processed is introduced into the processing chamber 101 as the silicon substrate 103 of FIG. 5 and is placed on the stage 104 equipped with the heating mechanism. Further, the temperature of the substrate is set to 400° C.

Further, a microwave of 2.45 GHz frequency is supplied from the coaxial waveguide 105 to the radial line slot antenna 106 for 1 minute, wherein the microwave thus supplied is introduced into the processing chamber 101 from the radial line slot antenna 106 through the dielectric plate 107. By exposing the surface of the silicon substrate to the high-density Kr plasma thus formed in the processing chamber 101, the terminating hydrogen are removed from the silicon surface of the substrate 1301.

Next, the Kr gas and the $O_2$ gas are introduced from the shower plate 102, and a silicon oxide film 1304 used for the tunneling insulation film is formed on the region A with a thickness of 3.5 nm. Next, a first polysilicon layer 1305 is deposited so as to cover the silicon oxide film 1304.

Next, the first polysilicon layer 1305 is removed from the regions B and C for the high voltage and low voltage transistors by a patterning process, such that the first polysilicon pattern 1305 is left only on the tunneling oxide film 1304 in the memory cell region A.

After this etching process, a cleaning process is conducted and the surface of the polysilicon pattern 1305 is terminated with hydrogen.

Figure 29:
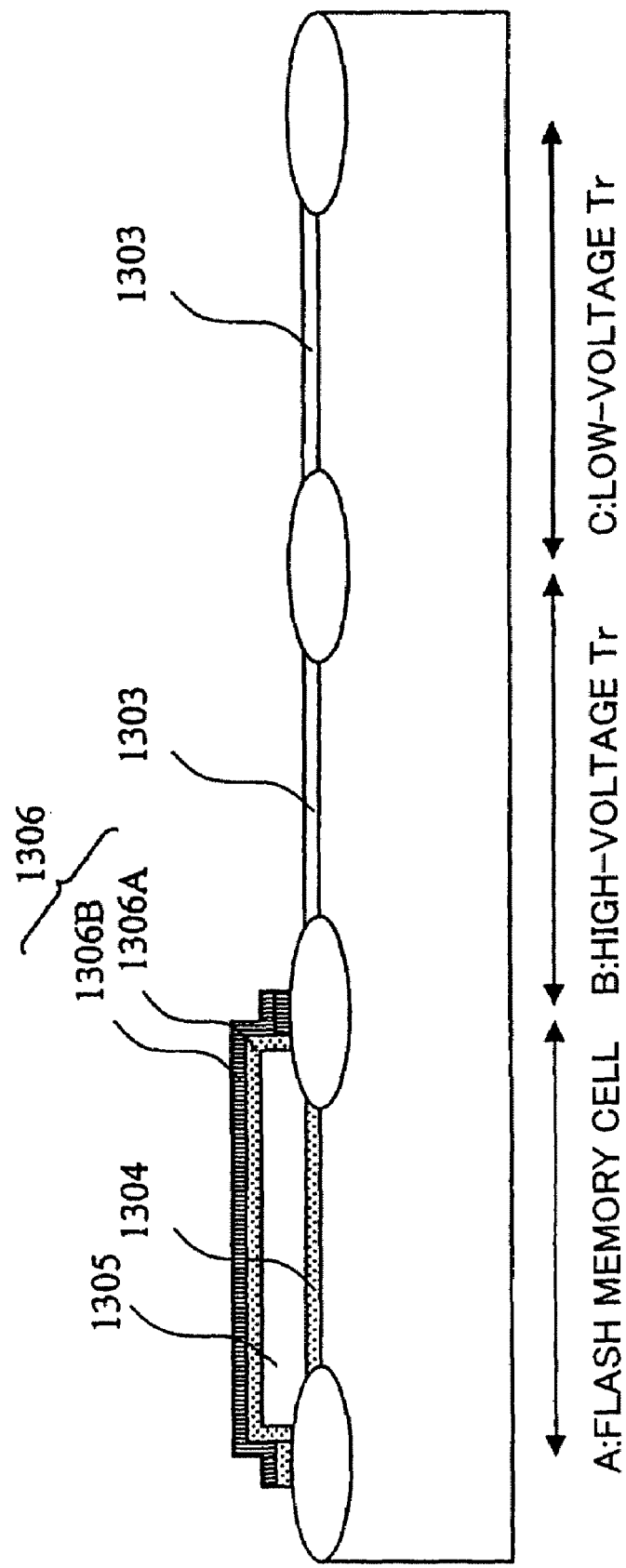

Next, in the step of FIG. 29, an insulation film 1306 having an ON structure and including a lower oxide film 1306A and an upper nitride film 1306B therein is formed so as to cover the surface of the polysilicon pattern 1305 similarly to the third embodiment.

More specifically, this ON film is formed as follows.

The vacuum vessel (processing chamber) 101 is evacuated to a vacuum state and the AR gas supplied from the shower plate 102 is switched to the Kr gas. Further, the pressure inside the processing chamber is set to about 133 Pa (1 Torr).

Next, the silicon substrate 1301 carrying thereon the polysilicon pattern 1305 in the state that the hydrogen termination is made is introduced into the processing chamber 101 and is placed on the stage 104 having the heating mechanism. Further, the temperature of the specimen is set to 400° C.

Next, a microwave of 2.45 GHz frequency is supplied to the radial line slot antenna 106 from the coaxial waveguide 105 for about 1 minute. Thereby, the microwave is introduced into the processing chamber 101 from the radial line slot antenna 106 through the dielectric plate 107, and there is formed a high-density Kr plasma. As a result, the surface of the polysilicon pattern 1305 is exposed to the Kr gas and the surface terminating hydrogen is removed.

Next, a Kr/O2 mixed gas is introduced into the processing chamber 101 from the shower plate 102 while maintaining the pressure of the processing chamber 101 to 133 Pa (1 Torr), and a silicon oxide film is formed on the polysilicon surface with a thickness of 3 nm.

Next, the supply of the microwave is shutdown temporarily and introduction of the Kr gas and the $O_2$ gas is interrupted. Next, the interior of the vacuum vessel (processing chamber) 101 is evacuated and the Kr gas and an $NH_3$ gas are introduced from the shower plate 102. The pressure inside the processing chamber 101 is set to about 13.3 Pa (100 mTorr) and the microwave of 2.45 GHz is supplied again into the processing chamber 101 via the radial line slot antenna. Thereby, high-density plasma is formed in the processing chamber and a silicon nitride film is formed on the silicon oxide film surface with the thickness of 6 nm.

Thus, there is formed an ON film with a thickness of 9 nm, wherein it should be noted that the ON film thus obtained was extremely uniform characterized by a uniform film thickness, and no dependence on the polysilicon surface orientation was observed.

Figure 30:
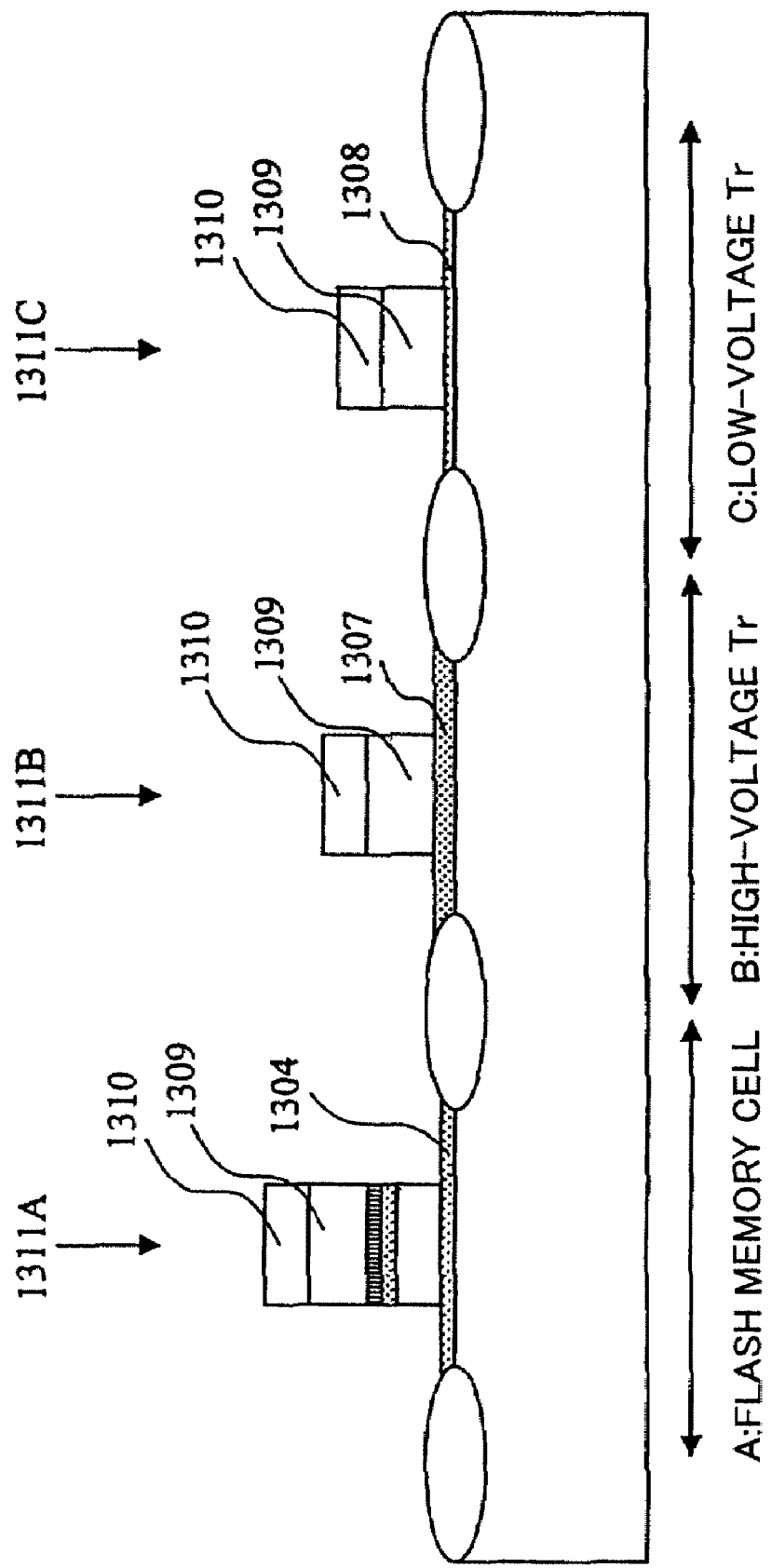

After such a process of formation of the ON film, the insulation film 1306 is removed from the regions B and C for the high-voltage and low-voltage transistors by conducting a patterning process in the step of FIG. 30, and ion implantation is conducted into the foregoing regions B and C of the high-voltage and low-voltage transistors for threshold control. Further, the oxide film 1303 is removed from the regions B and C and a gate oxide film 1307 is formed on the region B with a thickness of 5 nm. Thereafter, a gate oxide film 1308 is formed on the region C with a thickness of 3 nm.

After this, a second polysilicon layer 1309 and a silicide layer 1310 are formed consecutively on the entire structure including the field oxide film 1302, and there are formed gate electrodes 1311B and 1311C respectively in the high-voltage transistor region B and the low-voltage transistor region C by patterning the second polysilicon layer 1309 and the silicide layer 1310. Further, there is formed a gate electrode 1311A in correspondence to the memory cell region A.

After the step of FIG. 30, source and drain regions are formed according to a standard semiconductor process, and the device is completed by further conducting formation of interlayer insulation films and contact holes and formation of wiring patterns.

In the present invention, it should be noted that the insulation films 1306A or 1306B maintains excellent electric properties even when the thickness thereof is reduced to about one half the conventional thickness of the oxide film or nitride film. Thus, these silicon oxide film 1306A and silicon nitride film 1306B maintains excellent electric properties even when the thickness thereof is reduced. Further, these films are dense and have high quality. Further, it should be noted that, because the silicon oxide film 1306A and the silicon nitride film 1306B are formed at low temperature, there arises no problem of thermal budget at the interface between the polysilicon gate and the oxide film, and excellent interface is realized.

The flash memory device of the present invention can perform the writing and erasing of information at low voltage, and because of this, the formation of substrate current is suppressed. Thereby, deterioration of the tunneling insulation film is suppressed. Thus, it becomes possible to produce a non-volatile semiconductor memory with high yield by arranging the flash memory of the present invention in a two-dimensional array. The non-volatile semiconductor memory apparatus thus formed shows stable characteristics.

Thus, the flash memory device of the present invention is characterized by small leakage current due to the excellent film quality of the insulation films 1306A and 1306B. Further, it becomes possible to reduce the film thickness without increasing the leakage current. Thus, it becomes possible to perform the writing operation or erasing operation at an operational voltage of about 5V. As a result, the memory retention time of the flash memory device is increase by the order of 2 or more as compared with the conventional device, and the number of possible rewriting operation is increase by the order of 2 or more.

It should be noted that the film structure of the insulation film 1306 is not limited to the ON structure explained above but it is also possible to use an O structure formed of an oxide film similar to that of the first embodiment or an N structure that uses a nitride film similar to the case of the second embodiment. Further, it is possible to use an oxynitride film similar to the one shown in the fourth embodiment. Further, the insulation film 1306 may have an NO structure formed of a nitride film and an oxide film or an ONO structure in which an oxide film, a nitride film and an oxide film are laminated consecutively. Further, the insulation film 1306 may have an NONO structure in which a nitride film, an oxide film, a nitride film and an oxide film are laminated consecutively. Choice of any of the foregoing structures can be made according to the purpose from the viewpoint of compatibility with the gate insulation film used in the high voltage transistor or low voltage transistor in the peripheral circuit or from the viewpoint of possibility of shared use.

Eighth Embodiment

It should be noted that the formation of the gate insulation film by using the foregoing $Kr/O_2$ microwave-excited high-density plasma or the formation of the gate nitride film by using the Ar (or Kr)/$NH_3$ (or $N_2/H_2$) microwave-excited high-density plasma, is advantageous to the formation of a semiconductor integrated circuit device on a silicon-on-insulator wafer including a metal layer in the underlying silicon (metal-substrate SOI). It should be noted that the use of high temperature process is not possible in such a metal-substrate SOI. Particularly, the effect of removal of the terminating hydrogen appears conspicuously in the SOI structure having a small silicon thickness and performing completely depleted operation.

Figure 31:
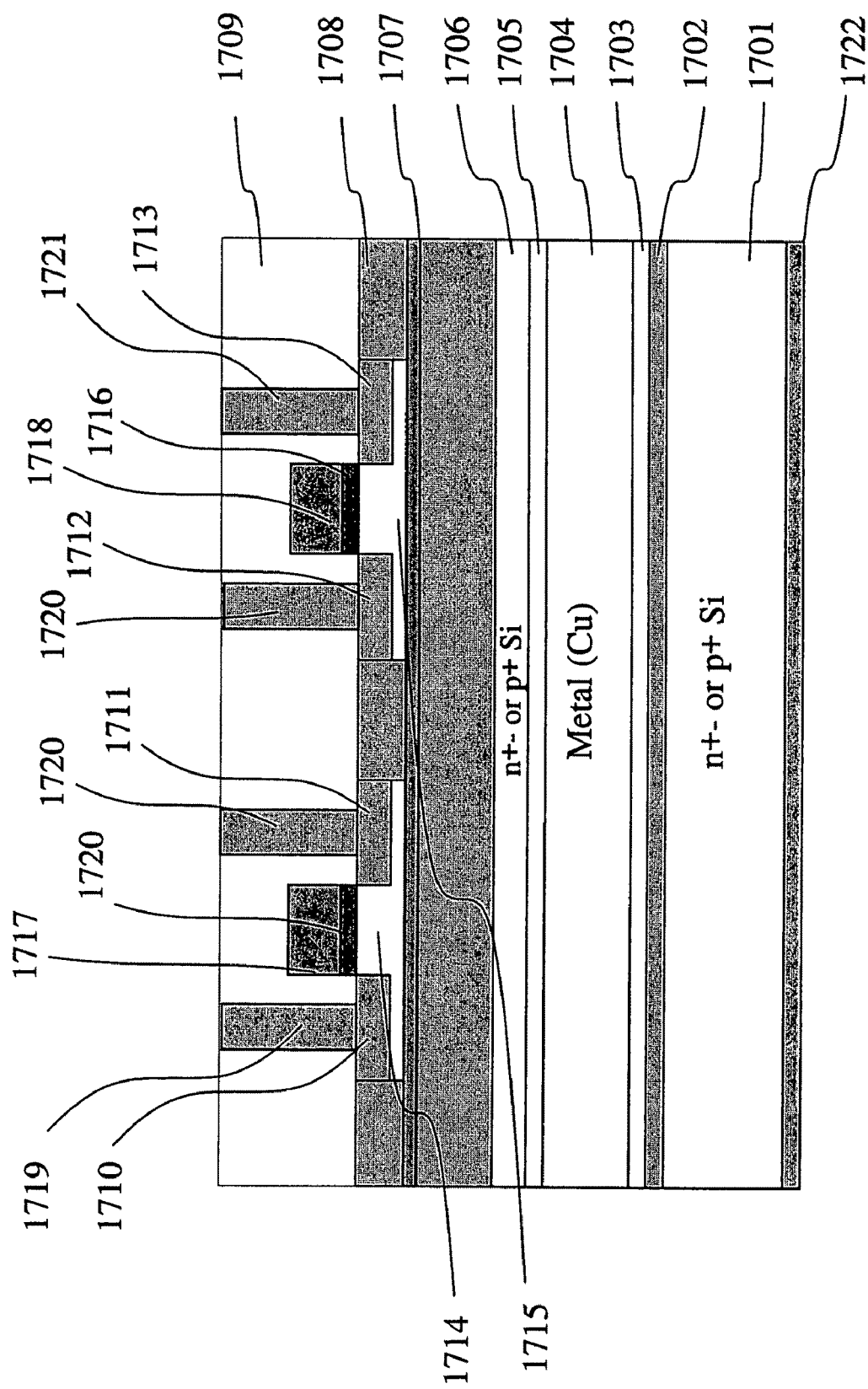
FIG. 31 is a schematic diagram showing the cross-sectional structure of a MOS transistor formed on a metal substrate SOI according to an eighth embodiment of the present invention.

FIG. 31 shows the cross-section of a MOS transistor having a metal-substrate SOI structure.

Referring to FIG. 31, 1701 is a low-resistance semiconductor layer of n+-type or p+-type, 1702 is a silicide layer such as NiSi, 1703 is a conductive nitride layer such as TaN or TiN, 1704 is a metal layer such as Cu, and the like, 1705 is a conductive nitride film such as TaN or TiN, 1706 is a low-resistance semiconductor layer of n+-type or p+-type, 1707 is a nitride insulation film such as AlN, $Si_3N_4$, and the like, 1708 is an $SiO_2$ film, 1709 is an $SiO_2$ layer or a BPSG layer or an insulation layer combining these, 1710 us a drain region of n+-type, 1711 us a source region of n+-type, 1712 is a drain region of p+-type, 1713 is a source region of p+-type, 1714 and 1715 are silicon semiconductor layers oriented in the <111> direction, 1716 is an $SiO_2$ film formed by the $Kr/O_2$ microwave-excited high-density plasma after removing the surface-terminating hydrogen by the procedure of the first embodiment of the present invention, 1717 and 1718 are respectively the gate electrodes of an n-MOS transistor and a p-MOS transistor and formed of Ta, Ti, TaN/Ta, TiN/Ti, and the like, 1719 is a source electrode of the n-MOS transistor, and 1720 is a drain electrode of the n-MOS transistor and a p-MOS transistor. Further, 1721 is a source electrode of a p-MOS transistor and 1722 is a substrate surface electrode.

In such a substrate including a Cu layer and protected by TaN or TiN, the temperature of thermal processing has to be about 700° C. or less for suppressing diffusion of Cu. Thus, the source or drain region of n+-type or p+-type is formed by conducting a thermal annealing process at 550° C. after ion implantation process of As+, $AsF_2$+ or $BF_2$+

In the semiconductor device having the device structure of FIG. 31, it should be noted that the comparison of the transistor sub-threshold characteristics between when the gate insulation film is formed by a thermal oxide film and when the gate insulation film is formed by the $Kr/O_2$ microwave-excited high-density plasma after removing the surface-terminating hydrogen by conducting the Kr plasma irradiation process, has revealed the fact that there appears a kink or leakage in the sub-threshold characteristics when the gate insulation film is formed by the thermal oxidation process, while when the gate insulation film is formed by the present invention, excellent sub-threshold characteristics are obtained.

When a mesa-type device isolation structure is used, it should be noted that a silicon surface having a surface orientation different from that of the silicon surface forming the flat part appears, at the sidewall part of the mesa device isolation structure. By forming the gate insulation film by the plasma oxidation process while using Kr, the oxidation of the mesa device isolation sidewall is achieved generally uniformly similar to the flat part, and excellent electric properties and high reliability are achieved.

Further, it becomes possible to form a metal-substrate SOI integrated circuit device having excellent electric properties and high reliability also when using a silicon nitride film formed by $Ar/NH_3$ according to the procedure of the second embodiment for the gate insulation film.

In the present embodiment, too, it is possible to obtain excellent electric characteristics even when the thickness of the silicon nitride film is set to 3 nm (1.5 nm in terms of silicon oxide film equivalent thickness), and the transistor drivability is improved by about twice as compared with using a silicon oxide film of 3 nm thickness.

Ninth Embodiment

Figure 32:
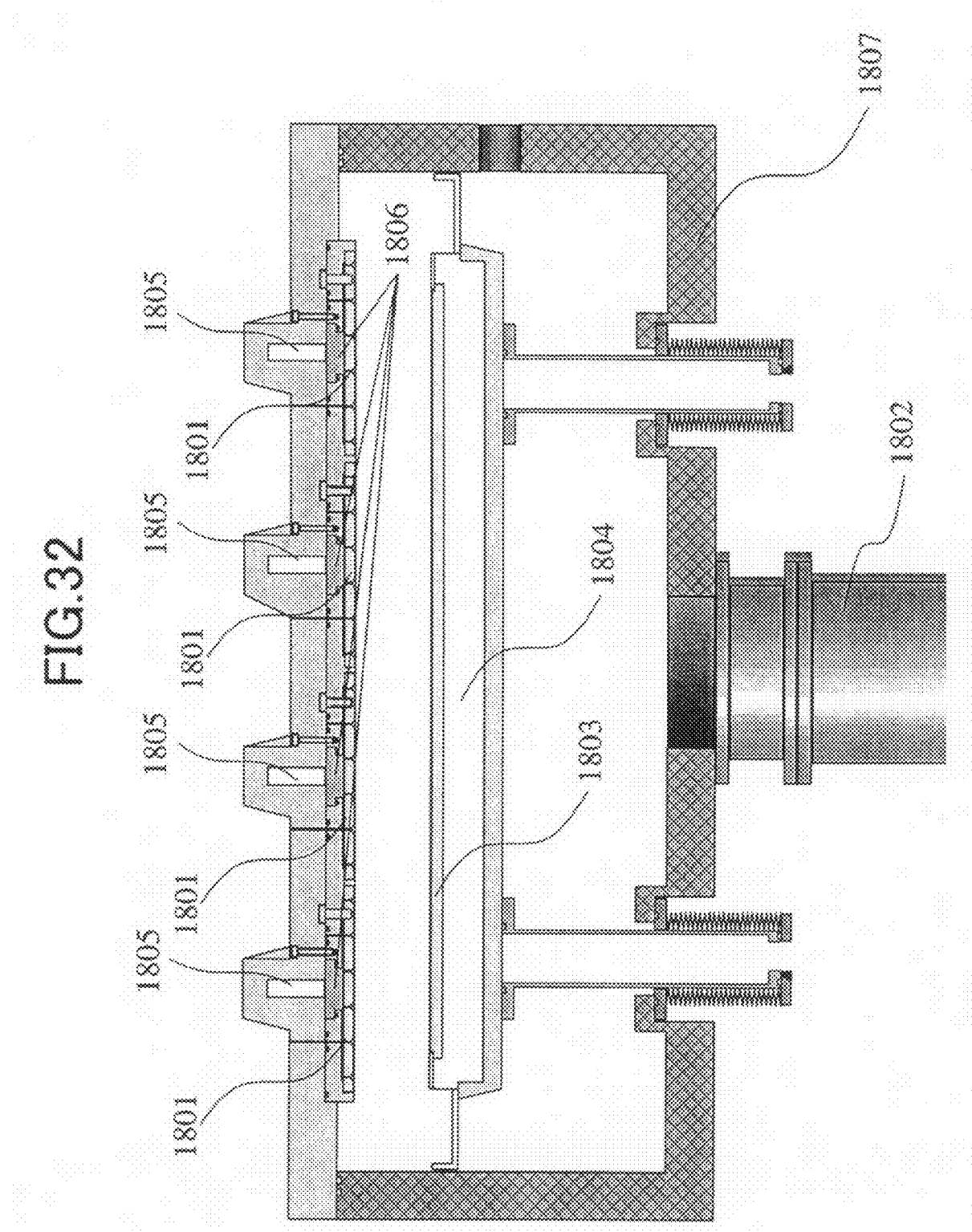
FIG. 32 is a schematic diagram of a plasma processing apparatus according to a ninth embodiment of the present invention applicable to a glass substrate or plastic substrate.

FIG. 32 schematically shows an example of the fabrication apparatus according to an eighth embodiment of the present invention intended to conduct oxidation processing, nitridation processing or oxynitridation processing on a large rectangular substrate such as a glass substrate or a plastic substrate on which liquid crystal display devices or organic electro-luminescence devices are formed.

Referring to FIG. 32, a vacuum vessel (processing chamber) 1807 is evacuated to a low pressure state and a $Kr/O_2$ mixed gas s introduced from a shower plate 1801 provided in the processing chamber 1807. Further, the processing chamber 1807 is evacuated by a lead screw pump 1802 such that the pressure inside the processing chamber 1807 is set to 133 Pa (1 Torr). Further, a glass substrate 1803 is placed on a stage 1804 equipped with a heating mechanism, and the temperature of the glass substrate is set to 300° C.

The processing chamber 1807 is provided with a large number of rectangular waveguides 1805 and microwaves are introduced into the processing chamber 1807 from respective slits of the foregoing rectangular waveguides 1805 via a dielectric plate 1806, and high-density plasma is formed in the processing chamber 1807. Thereby, the shower plate 1801 provided in the processing chamber 1807 functions also as a waveguide for propagating the microwave emitted by the waveguide in the right and left directions in the form of a surface wave.

Figure 33:
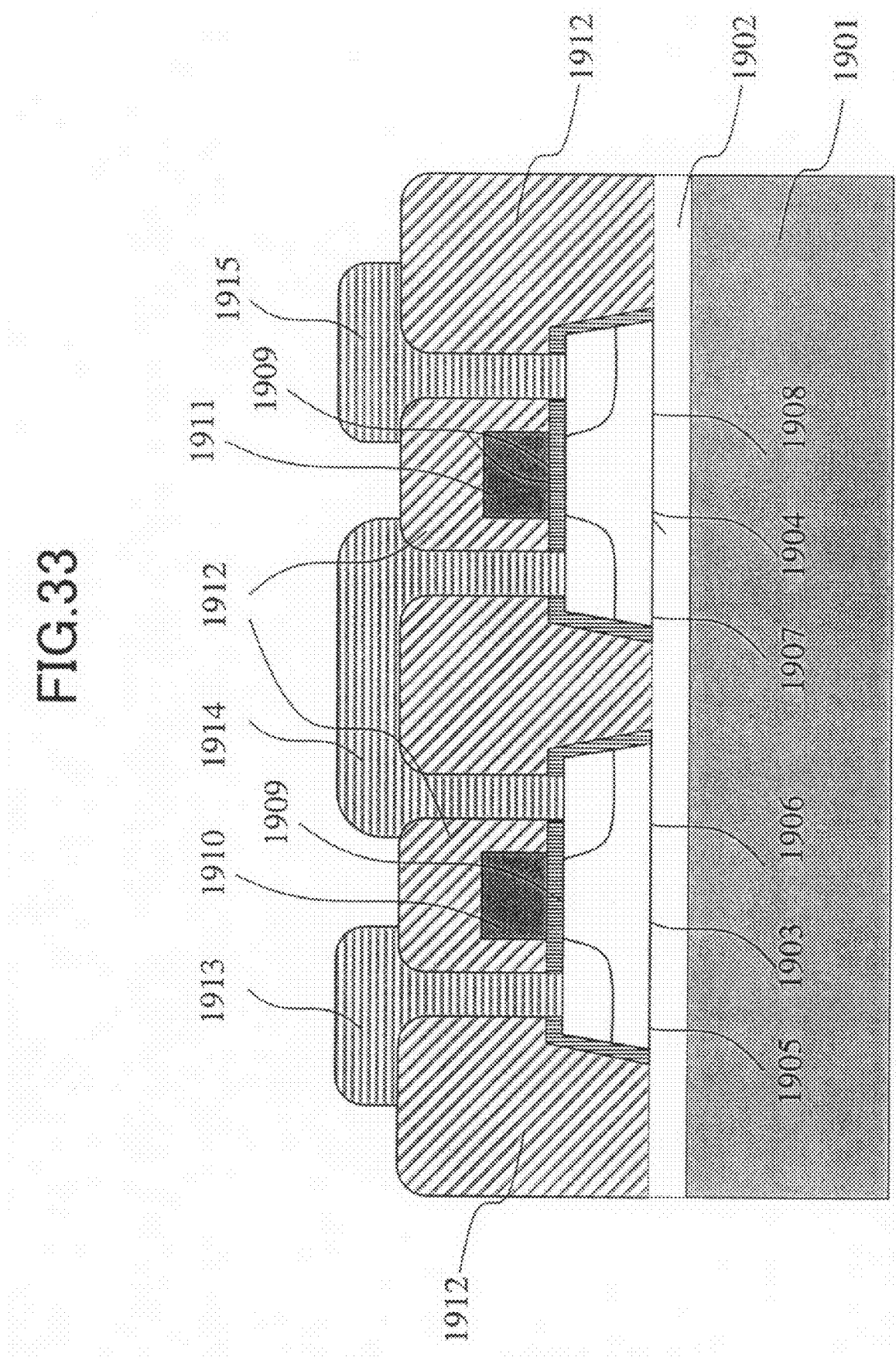
FIG. 33 is a schematic diagram showing the cross-sectional structure of a polysilicon transistor on an insulation film formed according to the plasma processing apparatus of FIG. 32.

FIG. 33 shows an example of a polysilicon thin film transistor (TFT) used for driving a liquid crystal display device or an organic EL photoemission device or for use in a processing circuit, wherein it should be noted that the polysilicon thin film transistor of FIG. 33 is formed by using the gate oxide film or gate nitride film of the present invention while using the apparatus of FIG. 32.

First, the example of using a silicon oxide film will be explained.

Referring to FIG. 33, 1901 is a glass substrate, 1902 is a $Si_3N_4$ film, 1903 is a channel layer of a polysilicon n-MOS transistor having a predominantly <111> orientation, 1905 and 1906 are respectively a source region and a drain region of the polysilicon n-MOS transistor, 1904 is a channel layer of a polysilicon p-MOS transistor having a predominantly <111> orientation, and 1907 and 1908 are respectively a source region and a drain region of the polysilicon p-channel MOS transistor. Further, 1901 is a gate electrode of the polysilicon n-MOS transistor while 1911 is a gate electrode of the polysilicon p-MOS transistor, 1912 is an insulation film such as $SiO_2$, BSG or BPSG, 1913 and 1914 are respectively the source electrode of the polysilicon n-MOS transistor (and simultaneously the drain electrode of the polysilicon p-MOS transistor), and 1915 is the source electrode of the polysilicon p-MOS transistor.

It should be noted that a polysilicon film formed on an insulation film takes a stable state when having the <111> surface orientation in the direction perpendicular to the insulation film. In this state, the polysilicon film is dense and well crystallized and thus provides high quality. In the present embodiment, it should be noted that 1909 is a silicon oxide film layer of the present invention formed by a procedure similar to the one explained with reference to the first embodiment by using the apparatus of FIG. 32 and has a thickness of 0.2 μm. The oxide film 1909 is formed on the <111> oriented polysilicon at 400° C. with a thickness of 3 nm.

According to the present invention, there occurred no thinning of oxide film at the sharp corner part of the device isolation region formed between the transistors, and it was confirmed that the silicon oxide film is formed with a uniform film thickness on the polysilicon film in any of the flat part and edge part. The ion implantation process for forming the source and drain regions was conducted without passing the ions through the gate oxide film, and the electrical activation was made at 400° C. As a result, the entire process can be conducted at a temperature of 400° C. or less and formation of transistors became possible on a glass substrate. The transistor thus formed had a mobility of about 300 $cm^2$/Vsec or more for electrons and about 150 $cm^2$/Vsec or more for holes. Further, a voltage of 12V or more was obtained for the source and drain breakdown voltages and for the gate breakdown voltage. Further, a high-speed operation exceeding 100 MHz became possible in the transistor having the channel length of about 1.5-2.0 nm. Further, it was confirmed that the silicon oxide film showed excellent leakage characteristics and excellent characteristics for the interface states formed at the polysilicon/oxide film interface.

By using the transistor of the present embodiment, the liquid crystal display devices or organic EL photoemission devices can provide various advantageous features such as large display area, low cost, high-speed operation, high reliability, and the like.

While the present embodiment is one in which the gate insulation film or the gate nitride film of the present invention is applied to a polysilicon, the present embodiment is applicable also to the gate oxide film or gate insulation film of an amorphous silicon thin-film transistor (TFT) or staggered-type thin-film transistor (TFT), which is used in a liquid crystal display device and the like.

Tenth Embodiment

Next, an embodiment of a three-dimensional stacked LSI in which an SOI device having a metal layer, a polysilicon device and an amorphous silicon device are stacked will be described.

Figure 34:
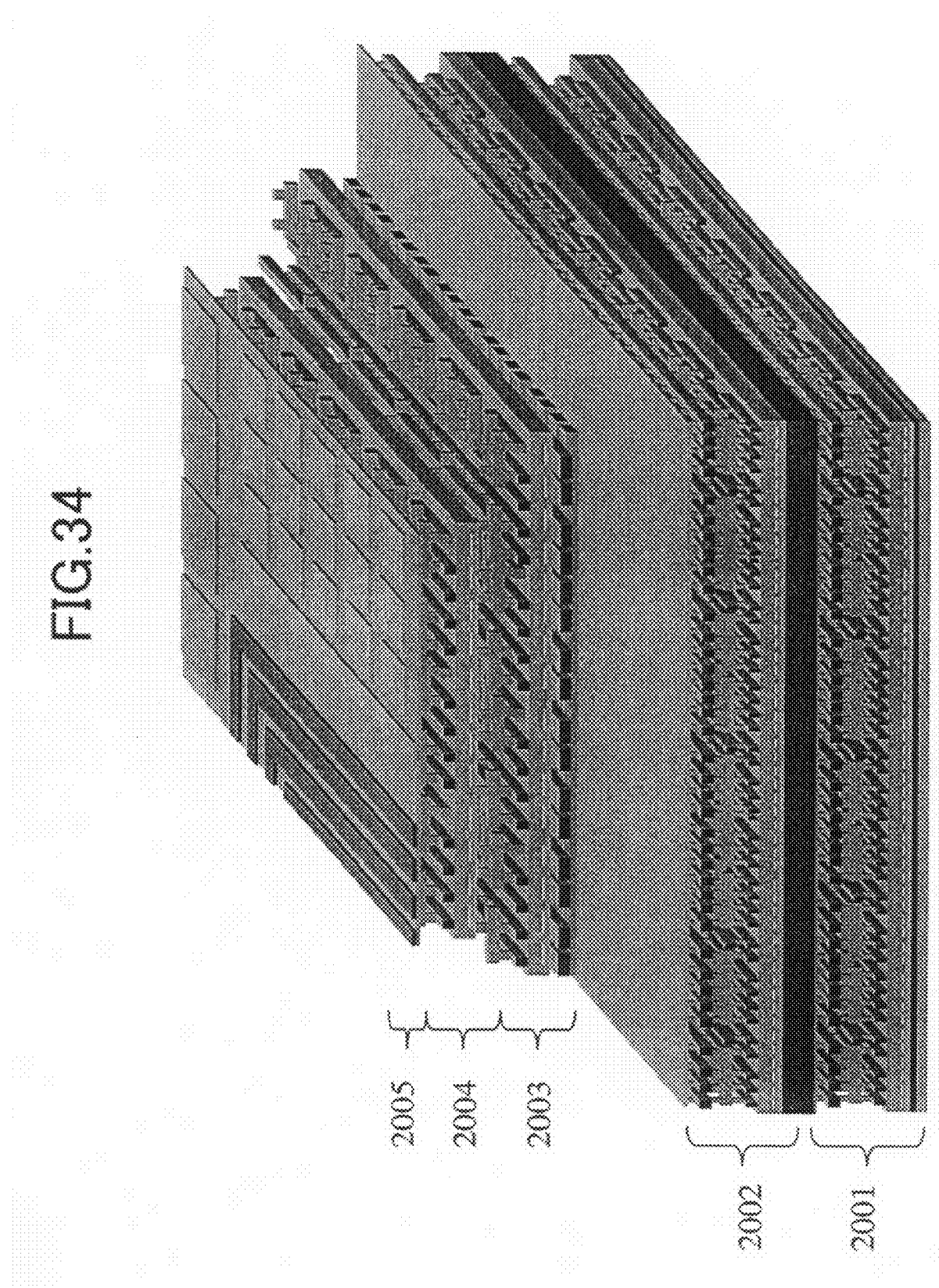
FIG. 34 is a schematic diagram showing the cross-sectional diagram of a three-dimensional LSI according to a tenth embodiment of the present invention.

FIG. 34 shows the cross-section of the three-dimensional LSI of the present invention schematically.

Referring to FIG. 34, 2001 is a first SOI device and wiring layer, 2002 is a second SOI device and a wiring layer, 2003 is a first polysilicon device and a wiring layer, 2004 is a second polysilicon device and a wiring layer, while 2005 is a layer of an amorphous semiconductor device and a functional-material device and includes a wiring layer thereof.

In the first SOI and wiring layer 2001 and also in the second SOI and wiring layer 2002, there are formed various parts such as digital processing parts, high-precision and high-speed analog parts, synchronous DRAM parts, power supply parts, interface circuit parts, and the like, by using the SOI transistors explained with reference to the seventh embodiment.

In the first polysilicon device and wiring layer 2003, there are formed various parallel digital processing parts, inter-functional block repeater parts, memory device parts, and the like, by using the polysilicon transistors or flash memories explained with reference to the sixth or eighth embodiments together with the wiring layer of the first polysilicon device layer 2003.

In the second polysilicon device and wiring layer 2004, there are formed parallel analog processing parts such as an amplifier, A/D converter, and the like, by using the polysilicon transistor explained with reference to the eighth embodiment. Further, optical sensors, sound sensors, touch sensors, wireless transceiver parts, and the like, are formed in the amorphous semiconductor device/functional-material device and wiring layer 2005.

The signals formed by the optical sensors, sound sensors, touch sensors, wireless transceiver parts, and the like, provided in the amorphous semiconductor device/functional-material and wiring layer 2005 are processed by the parallel analog processing part such as an amplifier or A/D converter in the second polysilicon device and wiring layer 2004, and are forwarded further to the parallel digital processing parts and the memory device parts formed in the second polysilicon device and wiring layer 2004 by the polysilicon transistors and flash memory devices. The signals thus processed are then processed by the digital processing parts, high-precision and high-speed analog parts or the synchronous DRAM parts provided in the first SOI and wiring layer 2001 or second SOI and wiring layer 2002 by using the SOI transistors.

Further, the inter-functional block repeater part provided in the first polysilicon device and the wiring layer 2003 does not occupy a large area even when provided with plural numbers, and it is possible to achieve synchronization of signals all over the LSI.

It should be noted that such a three-dimensional LSI has become possible as a result of the technology explained in detail with reference to the embodiments.

According to the present invention, it becomes possible to form a tunneling oxide film on a silicon surface such as a silicon substrate in the form that an oxide film and a nitride film are laminated or a nitride film and an oxide film and a nitride film are laminated consecutively such that the tunneling oxide film as a whole as the composition of an oxynitride film. Thereby, the leakage current is reduced significantly while simultaneously reducing the film thickness. With this, it becomes possible to increase the tunneling current density of a flash memory device, and the like, at the time of writing, and the operational speed is improved. Further, the operational voltage is reduced.

What is claimed is:

1. A method of forming a dielectric film, comprising:
   forming a silicon oxide film on a surface; and
   modifying a surface of said silicon oxide film by exposing the same to hydrogen nitride radicals NH* in the absence of a Si-containing gas, wherein said hydrogen nitride radicals NH* are formed by a microwave plasma formed in a mixed gas of an inert gas selected from the group consisting of Ar and Kr, and a mixed gas of $N_2$ gas and $H_2$ gas.

2. A method of forming a dielectric film, comprising:
   forming a silicon oxide film on a surface; and
   modifying a surface of said silicon oxide film by exposing the same to microwave plasma formed in a mixed gas of an inert gas selected from the group consisting of Ar and Kr, and a mixed gas of $N_2$ gas and $H_2$ gas in the absence of a Si-containing gas.

3. A method of fabricating a semiconductor device, comprising:
   forming a silicon oxide film on a silicon substrate by oxidation;
   modifying a surface of said silicon oxide film by exposing the same to hydrogen nitride radicals NH* in the absence of a Si-containing gas; and
   forming a gate electrode on said modified silicon oxide film, wherein said hydrogen nitride radicals (NH*) are formed by microwave plasma formed in a mixed gas of an inert gas selected from the group consisting of Ar and Kr, and a mixed gas containing $N_2$ gas and $H_2$ gas.

4. A method of fabricating a semiconductor device, comprising:
   forming a silicon oxide film on a silicon substrate by oxidation;
   modifying a surface of said silicon oxide film by exposing said surface to a microwave plasma formed in a mixed gas of an inert gas selected from the group consisting of Ar and Kr and a mixed gas of $N_2$ gas and $H_2$ gas in the absence of a Si-containing gas, and
   forming a gate electrode on said modified silicon oxide film.

5. A method of fabricating a semiconductor device, comprising the steps of:
   removing hydrogen atoms terminating a surface of a semiconductor substrate by exposing said surface of said semiconductor substrate to rare gas plasma; and
   forming a film on said semiconductor substrate surface from which said terminating hydrogen atoms are removed.

6. The method as claimed in claim 5, wherein said film comprises any of silicon oxide, silicon nitride and silicon oxynitride.

* * * * *